US011460517B2

(12) United States Patent
Ha et al.

(10) Patent No.: US 11,460,517 B2
(45) Date of Patent: Oct. 4, 2022

(54) SYSTEMS, APPARATUS, AND METHODS FOR LOCATING A FAULT IN A PLURALITY OF WINDINGS OF A TRANSFORMER

(71) Applicant: General Electric Technology GmbH, Baden (CH)

(72) Inventors: Hengxu Ha, Stafford (GB); Xiuda Ma, Nanjing (CN)

(73) Assignee: General Electric Technology Gmbh, Baden (CH)

( * ) Notice: Subject to any disclaimer, the term of this patent is extended or adjusted under 35 U.S.C. 154(b) by 618 days.

(21) Appl. No.: 16/452,059

(22) Filed: Jun. 25, 2019

(65) Prior Publication Data

US 2020/0408826 A1    Dec. 31, 2020

(51) Int. Cl.
*G01R 31/72* (2020.01)
*H01F 27/28* (2006.01)

(52) U.S. Cl.
CPC ............. *G01R 31/72* (2020.01); *H01F 27/28* (2013.01)

(58) Field of Classification Search
None
See application file for complete search history.

(56) References Cited

FOREIGN PATENT DOCUMENTS

| CN | 1181355 C | * | 12/2004 | |
|---|---|---|---|---|
| CN | 104852354 A | * | 8/2015 | |
| EP | 3 553 539 A1 | | 10/2019 | |
| WO | WO-2005064759 A1 | * | 7/2005 | ............. H02H 7/045 |

* cited by examiner

*Primary Examiner* — Patrick Assouad
*Assistant Examiner* — Haidong Zhang
(74) *Attorney, Agent, or Firm* — Eversheds Sutherland (US) LLP

(57) ABSTRACT

There is provided systems, apparatus, and methods for locating a fault in a plurality of windings of a transformer. In one embodiment, the apparatus may include: a measurement device configured to measure electrical flow parameters of the transformer when the transformer is in an online mode; and a fault location determination unit configured to determine electrical flow parameters of the windings from the measured electrical flow parameters of the transformer, wherein the fault location determination unit is configured to process the determined electrical flow parameters of the windings to determine the location of the fault in the windings.

20 Claims, 12 Drawing Sheets

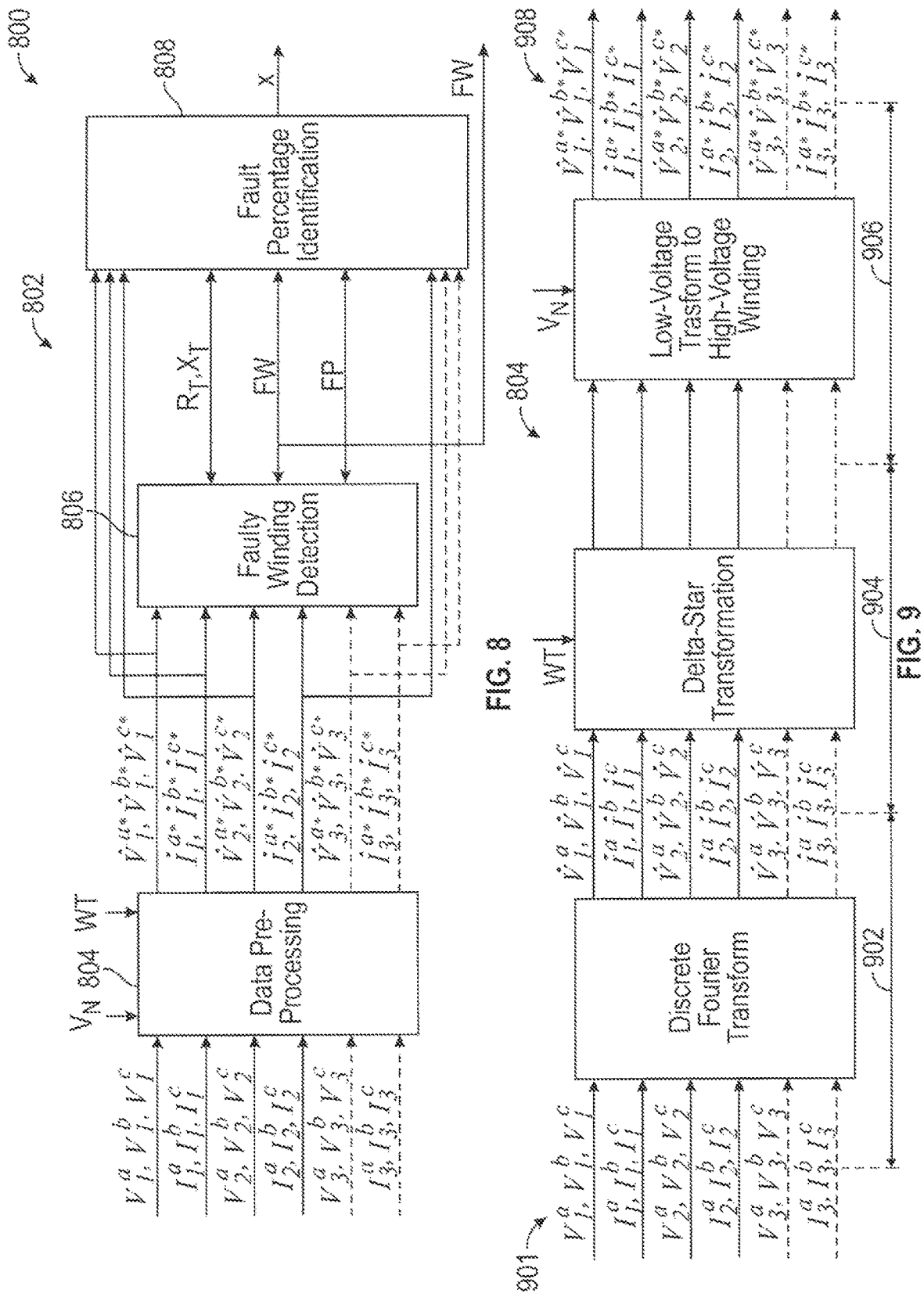

SYSTEMS, APPARATUS, AND METHODS FOR LOCATING A FAULT IN A PLURALITY OF WINDINGS OF A TRANSFORMER

BACKGROUND

Transformers typically have two or three windings with three phases with different voltage levels. Normally, when the transformer experiences a fault, the operation of the transformer needs to be halted, and a human operator needs to spend time to identify the location of the fault. This can be a slow, inefficient process and may result in a longer "black-out" period causing in a loss of power to a community, for example.

SUMMARY OF THE DISCLOSURE

Systems, apparatus, and methods for locating a fault in a plurality of windings of a transformer are disclosed. Further, certain embodiments of the disclosure can also provide systems, apparatus, and methods for locating a fault in a plurality of windings of a transformer through computer-implemented algorithms that measures various parameters, such as transformer voltage and current values and perform processing to determine the fault location (for example, down to the specific windings or turns). Systems, apparatus, and methods according to certain embodiments of the disclosure can, in certain instances, provide a technical effect and/or solution of increasing the efficiency of transformer fault detection by identifying the specific location of the fault without relying entirely on a human operator.

In various embodiments, a computer-implemented method of locating a fault in one or more windings of a transformer is provided. The computer-implemented method may include measuring electrical flow parameters of the transformer when the transformer is in an online mode. In various embodiments, the computer-implemented method may also include determining electrical flow parameters of the one or more windings from the measured electrical flow parameters of the transformer. In various embodiments, the computer-implemented method may also include determining a location of the fault in the one or more windings based at least on the determined electrical flow parameters.

In various embodiments, determining the location of the fault in the one or more windings includes determining in which of the one or more windings the fault is located.

In various embodiments, determining the location of the fault in the one or more windings further includes determining in which of a plurality of turns of the one or more windings the fault is located.

In various embodiments, the computer-implemented method may also include determining one or more electrical phasor values from the measured electrical flow parameters of the transformer. In various embodiments, the computer-implemented method may also include determining the electrical flow parameters of the one or more windings from the determined one or more electrical phasor values.

In various embodiments, the computer-implemented method may also include determining one or more phase-comparison voltage values and one or more phase-comparison current values by comparing the determined electrical flow parameters of the one or more windings. In various embodiments, the computer-implemented method may also include determining one or more excitation voltage values of the one or more windings from the determined one or more phase-comparison voltage values and one or more phase-comparison current values. In various embodiments, the computer-implemented method may also include determining one or more winding-comparison excitation voltage values by comparing the determined one or more excitation voltage values of the one or more windings. In various embodiments, the computer-implemented method may also include comparing the determined one or more winding-comparison excitation voltage values. In various embodiments, the computer-implemented method may also include determining in which of the one or more windings the fault is located based on the comparison of the one or more winding-comparison excitation voltage values.

In various embodiments, the computer-implemented method may also include determining the location of the fault based on an equivalent circuit of the multi-phase transformer which represents voltage and current conditions in the one or more windings, impedances of the one or more windings, a transformer magnetizing impedance, and at least one of a phase to ground fault on the one or more windings or a phase to phase fault on the one or more windings. In various embodiments, the computer-implemented method may also include determining the voltage and current conditions from the determined electrical flow parameters of the one or more windings.

In various embodiments, the equivalent circuit of the multi-phase transformer further represents at least one of a transformer leakage resistance or a transformer leakage reactance.

In various embodiments, the computer-implemented method may also include determining the location of the fault based on an equivalent circuit of the single-phase transformer which represents voltage and current conditions in the one or more windings, impedances of the one or more windings, a transformer magnetizing impedance, and at least one of an inter-turn fault, a winding to winding fault, or a winding to ground fault on the one or more windings. In various embodiments, the computer-implemented method may also include determining the voltage and current conditions from the determined electrical flow parameters of the windings.

In various embodiments, a system or apparatus for locating a fault in one or more windings of a transformer is provided. The system or apparatus may include a measurement device configured to measure electrical flow parameters of the transformer when the transformer is in an online mode. In various embodiments, the system or apparatus may also include a fault location determination unit configured to determine electrical flow parameters of the one or more windings of the transformer based at least on the measured electrical flow parameters of the transformer, wherein the fault location determination unit is further configured to determine a location of the fault in the one or more windings based at least on the determined electrical flow parameters.

In various embodiments, determining the location of the fault in the one or more windings includes determining in which of the one or more windings the fault is located.

In various embodiments, determining the location of the fault in the one or more windings further includes determining in which of a plurality of turns of the one or more windings the fault is located.

In various embodiments, the fault location determination unit is further configured to determine one or more zero-sequence current values from the determined electrical flow parameters of the one or more windings, and wherein the fault location determination unit is further configured to compare each of the one or more zero-sequence current values with one or more neutral current values of the one or more windings, and wherein the fault location determination unit is further configured to determine the location of the fault based on the comparison.

In various embodiments, the fault location determination unit is further configured to determine one or more phase-comparison voltage values and one or more phase-comparison current values by comparing the determined electrical flow parameters of the one or more windings. In various embodiments, the fault location determination unit is further configured to determine one or more excitation voltage values of the one or more windings from the determined one or more phase-comparison voltage values and one or more phase-comparison current values. In various embodiments, the fault location determination unit is further configured to determine one or more winding-comparison excitation voltage values by comparing the determined one or more excitation voltage values of the one or more windings. In various embodiments, the fault location determination unit is further configured to compare the determined one or more winding-comparison excitation voltage values. In various embodiments, the fault location determination unit is further configured to determine in which of the one or more windings the fault is located based on the comparison of the one or more winding-comparison excitation voltage values.

In various embodiments, the transformer is a multi-phase transformer, and wherein the fault location determination unit is further configured to determine the location of the fault based on an equivalent circuit of the multi-phase transformer which represents voltage and current conditions in the one or more windings, impedances of the one or more windings, a transformer magnetizing impedance, and at least one of a phase to ground fault on the one or more windings or a phase to phase fault on the one or more windings, and wherein the fault location determination unit is further configured to determine the voltage and current conditions from the determined electrical flow parameters of the one or more windings.

In various embodiments, equivalent circuit of the multi-phase transformer further represents at least one of a transformer leakage resistance or a transformer leakage reactance.

In various embodiments, the transformer is a single-phase transformer, and wherein the fault location determination unit is further configured to determine the location of the fault based on an equivalent circuit of the single-phase transformer which represents voltage and current conditions in the one or more windings, impedances of the one or more windings, a transformer magnetizing impedance, and an inter-turn fault on the one or more windings, and wherein the fault location determination unit is further configured to determine the voltage and current conditions from the determined electrical flow parameters of the windings.

In various embodiments, the transformer is a single-phase transformer, and the fault location determination unit is further configured to determine the location of the fault based on an equivalent circuit of the single-phase transformer which represents voltage and current conditions in the one or more windings, impedances of the one or more windings, a transformer magnetizing impedance, and a winding to winding fault between the one or more windings, and wherein the fault location determination unit is further configured to determine the voltage and current conditions from the determined electrical flow parameters of the windings.

In various embodiments, the transformer is a single-phase transformer, and the fault location determination unit is further configured to determine the location of the fault based on an equivalent circuit of the single-phase transformer which represents voltage and current conditions in the one or more windings, impedances of the one or more windings, a transformer magnetizing impedance, and a winding to ground fault the one or more windings, and wherein the fault location determination unit is further configured to determine the voltage and current conditions from the determined electrical flow parameters of the windings.

Additional systems, methods, apparatus, features, and aspects are realized through the techniques of various embodiments of the disclosure. Other embodiments and aspects of the disclosure are described in detail herein and are considered a part of the claimed subject matter. Other features can be understood and will become apparent with reference to the description and to the drawings.

BRIEF DESCRIPTION OF THE FIGURES

FIG. 8 shows schematically a block diagram representative of a fault location determination unit of a system in accordance with at least one embodiment of the disclosure.

FIGS. 9 to 14 illustrate a fault location determination process using the fault location determination unit to locate a fault in the windings of a three-phase transformer in accordance with at least one embodiment of the disclosure.

DETAILED DESCRIPTION

Figure 1:
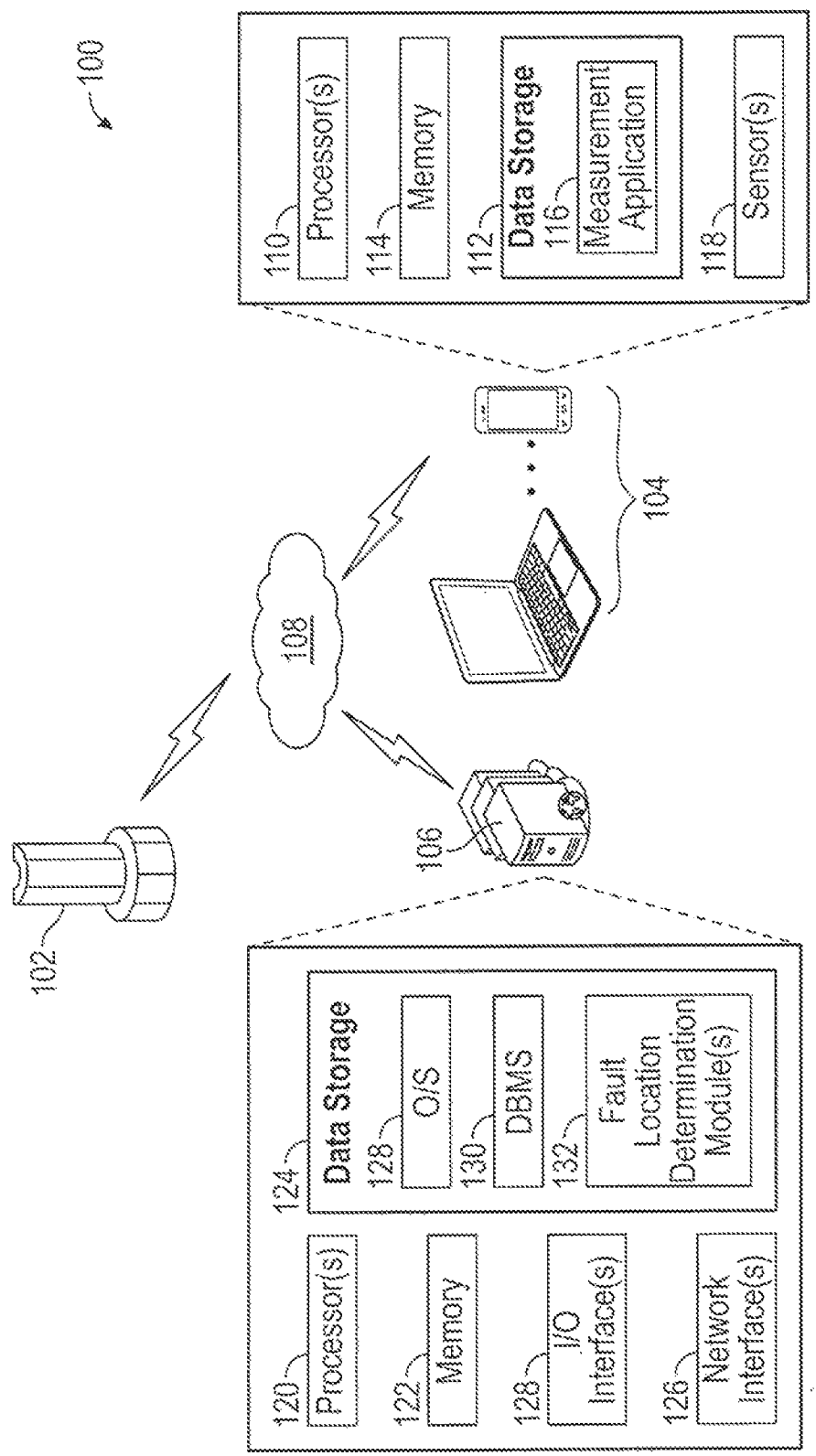
FIG. 1 illustrates a block diagram of an example system architecture in accordance with at least one embodiment of the disclosure.

Systems, apparatus, and methods for locating a fault in a plurality of windings of a transformer are disclosed.

In some embodiments, there is provided a system or an apparatus for locating a fault in a plurality of windings of a transformer. The system or apparatus may include a measurement device (for example, the measurement device 104 of FIG. 1) configured to measure electrical flow parameters of the transformer when the transformer is in an online mode. The system or apparatus may also include a fault location determination unit configured to determine electrical flow parameters of the windings from the measured electrical flow parameters of the transformer, wherein the fault location determination unit may be configured to process the determined electrical flow parameters of the windings to determine the location of the fault in the windings.

In some embodiments, the measurement device may include one or more measurement sensors. In the case of the measurement device including multiple measurement sensors, each measurement sensor may be configured to measure either a single electrical flow parameter or multiple electrical flow parameters of the transformer. The electrical flow parameters of the transformer may include voltages and/or currents of the transformer. The electrical flow parameters of the windings may include voltages and/or currents of the windings.

In some embodiments, the transformer may have an online mode and an offline mode. The transformer in its online mode may be electrically connected to an electrical network for which the transformer performs its normal function, while the transformer in its offline mode may be electrically disconnected from the same electrical network.

In some embodiments, the provision of the fault location determination unit in the system may enable the identification of the fault location even when the transformer remains online (for example, when the transformer is electrically connected to the electrical network). This may advantageously remove the need to switch the transformer into its offline mode for fault location determination purposes which would have the adverse effect of further increasing power outage time (e.g., "black-outs") that would inconvenience end users and an electrical network operator. In addition, eliminating the need to switch the transformer into its offline mode for fault location determination purposes may reduce the overall time taken to determine the location of the fault, and thus may enable a quicker response to the fault in order to restore normal operation of the transformer. Further, the configuration of the fault location determination unit to be able to identify the fault location using the measured electrical flow parameters of the transformer may permit the use of measurement sensors which are already in place to monitor the transformer, thus obviating the need to add new hardware.

In some embodiments, the system or apparatus may be used with a wide range of transformers including, but not limited to, a single-phase transformer, a multi-phase transformer (e.g. a three-phase transformer), a shell-type transformer, and a core-type transformer.

In some embodiments, the determination of the location of the fault in the windings may include determining which of the windings is the location of the fault, and preferably further includes determining which of a plurality of turns of one or more of the windings is the location of the fault. The determination of the location of the fault in the windings can be carried out in a different number of ways, examples of which are described as follows.

In some embodiments, the system or apparatus may be configured for locating a fault in a plurality of windings of a multi-phase transformer, the fault location determination unit may be configured to determine electrical phasor values from the measured electrical flow parameters of the transformer, and the fault location determination unit may be configured to determine the electrical flow parameters of the windings from the determined electrical phasor values. Such configuration of the fault location determination unit may improve the accuracy of the determination of the location of a fault in a plurality of windings of a multi-phase transformer.

In some embodiments, the determination of the location of the fault in the windings may involve the use of a zero-sequence current differential method. For example, the fault location determination unit may be configured to determine one or more zero-sequence current values from the determined electrical flow parameters of the windings, and the fault location determination unit may be configured to compare the or each zero-sequence current value with one or more neutral current values of the windings so as to determine which of the windings is the location of the fault.

In some embodiments, the determination of the location of the fault in the windings may involve the use of a voltage differential method. For example, the fault location determination unit may be configured to determine phase-comparison voltage values and phase-comparison current values by comparing the determined electrical flow parameters of the windings; determine excitation voltage values of the windings from the determined phase-comparison voltage values and phase-comparison current values; determine winding-comparison excitation voltage values by comparing the determined excitation voltage values of the windings; and compare the determined winding-comparison excitation voltage values so as to determine which of the windings is the location of the fault.

In some embodiments, a phase-comparison voltage may be the differential between voltages of different phases, and a phase-comparison current may be the differential between currents of different phases. Additionally, a winding-comparison voltage may be the differential between voltages of different windings, a winding-comparison current may be the differential between currents of different windings, and a winding-comparison excitation voltage may be the differential between excitation voltages of different windings.

In some embodiments, the system or apparatus may be configured for locating a fault in a plurality of windings of a multi-phase transformer, and the fault location determination unit may be configured to determine the location of the fault based on an equivalent circuit of the multi-phase transformer which represents voltage and current conditions in the windings, impedances of the windings, transformer magnetizing impedance, and a phase to ground fault on one or more of the windings. The fault location determination unit may also be configured to determine the voltage and current conditions from the determined electrical flow parameters of the windings. The fault location determination unit may also be configured to determine the location of the fault based on an equivalent circuit of the multi-phase transformer which represents voltage and current conditions in the windings, impedances of the windings, transformer magnetizing impedance, and a phase to phase fault on one or more of the windings. The fault location determination unit may also be configured to determine the voltage and current conditions from the determined electrical flow parameters of the windings.

In such embodiments in which the system or apparatus is configured for locating a fault in a plurality of windings of a multi-phase transformer, the equivalent circuit of the multi-phase transformer may further represent transformer leakage resistance and/or transformer leakage reactance.

In some embodiments, the system or apparatus may be configured for locating a fault in a pair of windings of a single-phase transformer instead of or in addition to a multi-phase transformer, exemplary configurations of which are described as follows.

In a first exemplary configuration, the fault location determination unit may be configured to determine the location of the fault based on an equivalent circuit of the single-phase transformer which represents voltage and current conditions in the windings, impedances of the windings, transformer magnetizing impedance, and an inter-turn fault on one or more of the windings, wherein the fault location determination unit may be configured to determine the voltage and current conditions from the determined electrical flow parameters of the windings.

In a second exemplary configuration, the fault location determination unit may be configured to determine the location of the fault based on an equivalent circuit of the single-phase transformer which represents voltage and current conditions in the windings, impedances of the windings, transformer magnetizing impedance, and a winding to winding fault between the windings, wherein the fault location determination unit may be configured to determine the voltage and current conditions from the determined electrical flow parameters of the windings.

In a third exemplary configuration, the fault location determination unit may be configured for locating a fault in a pair of windings of a single-phase transformer, and the fault location determination unit may be configured to determine the location of the fault based on an equivalent circuit of the single-phase transformer which represents voltage and current conditions in the windings, impedances of the windings, transformer magnetizing impedance, and a winding to ground fault in one or more of the windings, wherein the fault location determination unit may be configured to determine the voltage and current conditions from the determined electrical flow parameters of the windings.

In some embodiments, the system or apparatus may form part of a transformer protection equipment so that, after the location of the fault in the windings is determined, the transformer protection equipment provides the fault location to an operator.

Embodiments of the disclosure now will be described more fully hereinafter with reference to the accompanying drawings, in which certain embodiments are shown. This disclosure may, however, be embodied in many different forms and should not be construed as limited to the embodiments set forth herein; rather, these embodiments are provided so that this disclosure will be thorough and complete, and will fully convey the scope of the disclosure to those skilled in the art. Like numbers refer to like elements throughout.

Example System and Associated Architecture

FIG. 1 is a block diagram of an example system architecture in accordance with one or more embodiments of the disclosure. The illustrative system 100 may include one or more transformers 102, one or more measurement devices 104, and one or more transformer fault detection servers 106. The measurement devices 104 may include any of the types of devices described through reference to FIG. 1.

Any of the transformers 102, measurement devices 104, and transformer fault detection servers 106 may be configured to communicate with each other and any other component of the system 100 via one or more networks 108. The network 108 may include, but is not limited to, any one or a combination of different types of suitable communications networks such as, for example, cable networks, public networks (e.g., the Internet), private networks, wireless networks, cellular networks, or any other suitable private and/or public networks. Further, the network 108 may have any suitable communication range associated therewith and may include, for example, global networks (e.g., the Internet), metropolitan area networks (MANs), wide area networks (WANs), local area networks (LANs), or personal area networks (PANs). In addition, the network 108 may include any type of medium over which network traffic may be carried including, but not limited to, coaxial cable, twisted-pair wire, optical fiber, a hybrid fiber coaxial (HFC) medium, microwave terrestrial transceivers, radio frequency communication mediums, satellite communication mediums, or any combination thereof.

Each of the measurement devices 104 may include one or more processors 110 that may include any suitable processing unit capable of accepting digital data as input, processing the input data based on stored computer-executable instructions, and generating output data. The computer-executable instructions may be stored, for example, in the data storage 112 and may include, among other things, operating system software and application software. The computer-executable instructions may be retrieved from the data storage 112 and loaded into the memory 114 as needed for execution. The processor 110 may be configured to execute the computer-executable instructions to cause various operations to be performed. Each processor 110 may include any type of processing unit including, but not limited to, a central processing unit, a microprocessor, a microcontroller, a Reduced Instruction Set Computer (RISC) microprocessor, a Complex Instruction Set Computer (CISC) microprocessor, an Application Specific Integrated Circuit (ASIC), a System-on-a-Chip (SoC), a field-programmable gate array (FPGA), and so forth.

The data storage 112 may store program instructions that are loadable and executable by the processors 110, as well as data manipulated and generated by one or more of the processors 110 during execution of the program instructions. The program instructions may be loaded into the memory 114 as needed for execution. Depending on the configuration and implementation of each of the measurement devices 104, the memory 114 may be volatile memory (memory that is not configured to retain stored information when not supplied with power) such as random access memory (RAM) and/or non-volatile memory (memory that is configured to retain stored information even when not supplied with power) such as read-only memory (ROM), flash memory, and so forth. In various implementations, the memory 114 may include multiple different types of memory, such as various forms of static random access memory (SRAM), various forms of dynamic random access memory (DRAM), unalterable ROM, and/or writeable variants of ROM such as electrically erasable programmable read-only memory (EEPROM), flash memory, and so forth.

Various program modules, applications, or the like may be stored in data storage 112 that may comprise computer-executable instructions that when executed by one or more of the processors 110 cause various operations to be performed. The memory 114 may have loaded from the data storage 112 one or more operating systems (O/S) that may provide an interface between other application software (e.g., dedicated applications, a browser application, a web-based application, a distributed client-server application, etc.) executing on the measurement device 104 and the hardware resources of the measurement device 104. More specifically, the O/S may include a set of computer-executable instructions for managing the hardware resources of the measurement devices 104 and for providing common services to other application programs (e.g., managing memory allocation among various application programs). The O/S may include any operating system now known or which may be developed in the future including, but not limited to, any mobile operating system, desktop or laptop operating system, mainframe operating system, or any other proprietary or open-source operating system.

The data storage 112 may additionally include various other program modules that may include computer-executable instructions for supporting a variety of associated functionality. For example, the data storage 112 may include one or more applications, including one or more measurement applications 116. In the embodiment shown, a measurement application 116 can include computer-executable instructions that in response to execution by one or more processors 110 cause operations to be performed including measuring electrical flow parameters of the transformer when the transformer is in an online mode. The operations to be performed may also include determining electrical flow parameters of the one or more windings from the measured electrical flow parameters of the transformer. The operations to be performed may also include determining a location of the fault in the one or more windings based at least on the determined electrical flow parameters.

In some embodiments, the operations to be performed may also include determining one or more electrical phasor values from the measured electrical flow parameters of the transformer. The operations to be performed may also include determining the electrical flow parameters of the one or more windings from the determined one or more electrical phasor values. The operations to be performed may also include determining one or more zero-sequence current values from the determined electrical flow parameters of the windings. The operations to be performed may also include comparing each of the one or more zero-sequence current values with one or more neutral current values of the one or more windings. The operations to be performed may also include determining the location of the fault based on the comparison. The operations to be performed may also include determining one or more phase-comparison voltage values and one or more phase-comparison current values by comparing the determined electrical flow parameters of the one or more windings. The operations to be performed may also include determining one or more excitation voltage values of the one or more windings from the determined one or more phase-comparison voltage values and one or more phase-comparison current values. The operations to be performed may also include determining one or more winding-comparison excitation voltage values by comparing the determined one or more excitation voltage values of the one or more windings. The operations to be performed may also include comparing the determined one or more winding-comparison excitation voltage values. The operations to be performed may also include determining in which of the one or more windings the fault is located based on the comparison of the one or more winding-comparison excitation voltage values. The operations to be performed may also include determining the location of the fault based on an equivalent circuit of the multi-phase transformer which represents voltage and current conditions in the one or more windings, impedances of the one or more windings, a transformer magnetizing impedance, and at least one of a phase to ground fault on the one or more windings or a phase to phase fault on the one or more windings. The operations to be performed may also include determining the voltage and current conditions from the determined electrical flow parameters of the one or more windings. The operations to be performed may also include determining the location of the fault based on an equivalent circuit of the single-phase transformer which represents voltage and current conditions in the one or more windings, impedances of the one or more windings, a transformer magnetizing impedance, and at least one of an inter-turn fault, a winding to winding fault, or a winding to ground fault on the one or more windings. The operations to be performed may also include determining the voltage and current conditions from the determined electrical flow parameters of the windings.

The measurement device 104 may also include one or more sensors 118, such as image sensors and/or data collection devices (e.g., a microphone, cameras, video cameras, near field communication (NFC) scanners, RF scanners, infrared scanners, quick response (QR) code scanners, etc.) to capture data from the one or more transformers 102.

The transformer fault detection servers 106 may include one or more processors 120, and one or more memories 122 (referred to herein generically as memory 122). The one or more processors 120 may include any suitable processing unit capable of accepting digital data as input, processing the input data based on stored computer-executable instructions, and generating output data. The computer-executable instructions may be stored, for example, in the data storage 124 and may include, among other things, operating system software and application software. The computer-executable instructions may be retrieved from the data storage 124 and loaded into the memory 122 as needed for execution. The one or more processors 120 may be configured to execute the computer-executable instructions to cause various operations to be performed. The one or more processors 120 may include any type of processing unit including, but not limited to, a central processing unit, a microprocessor, a microcontroller, a Reduced Instruction Set Computer (RISC) microprocessor, a Complex Instruction Set Computer (CISC) microprocessor, an Application Specific Integrated Circuit (ASIC), a System-on-a-Chip (SoC), a field-programmable gate array (FPGA), and so forth.

The data storage 124 may store program instructions that are loadable and executable by the one or more processors 120, as well as data manipulated and generated by the one or more processors 120 during execution of the program instructions. The program instructions may be loaded into the memory 122 as needed for execution. Depending on the configuration and implementation of the one or more transformer fault detection servers 106, the memory 122 may be volatile memory (memory that is not configured to retain stored information when not supplied with power) such as random access memory (RAM) and/or non-volatile memory (memory that is configured to retain stored information even when not supplied with power) such as read-only memory (ROM), flash memory, and so forth. In various implementations, the memory 122 may include multiple different types of memory, such as various forms of static random access memory (SRAM), various forms of dynamic random access memory (DRAM), unalterable ROM, and/or writeable variants of ROM such as electrically erasable programmable read-only memory (EEPROM), flash memory, and so forth.

The one or more transformer fault detection servers 106 may further include additional data storage 124 such as removable storage and/or non-removable storage including, but not limited to, magnetic storage, optical disk storage, and/or tape storage. Data storage 124 may provide non-volatile storage of computer-executable instructions and other data. The memory 122 and/or the data storage 124, removable and/or non-removable, are examples of computer-readable storage media (CRSM).

The one or more transformer fault detection servers 106 may further include network interfaces 126 that facilitate communication between the one or more transformer fault detection servers 106 and other devices of the illustrative system 100 (e.g., measurement devices 104, transformer fault detection servers 106, etc.) or application software via the network 108. The one or more transformer fault detection servers 106 may additionally include one or more respective input/output (I/O) interfaces 128 (and optionally associated software components such as device drivers) that may support interaction between a user and a variety of I/O devices, such as a keyboard, a mouse, a pen, a pointing device, a voice input device, a touch input device, gesture detection or input device, a display, speakers, a camera, a microphone, a printer, and so forth.

Referring again to the data storage 124, various program modules, applications, or the like may be stored therein that may comprise computer-executable instructions that when executed by the one or more processors 120 cause various operations to be performed. The memory 122 may have loaded from the data storage 124 one or more operating systems (O/S) 128 that may provide an interface between other application software (e.g., dedicated applications, a browser application, a web-based application, a distributed client-server application, etc.) executing on the one or more transformer fault detection servers 106 and the hardware resources of the transformer fault detection servers 106. More specifically, the O/S 128 may include a set of computer-executable instructions for managing the hardware resources of the transformer fault detection servers 106 and for providing common services to other application programs (e.g., managing memory allocation among various application programs). The O/S 128 may include any operating system now known or which may be developed in the future including, but not limited to, any mobile operating system, desktop or laptop operating system, mainframe operating system, or any other proprietary or open-source operating system.

The data storage 124 may further include one or more database management systems (DBMS) 130 for accessing, retrieving, storing, and/or manipulating data stored in one or more datastores. The DBMS 130 may use any of a variety of database models (e.g., relational model, object model, etc.) and may support any of a variety of query languages.

The data storage 124 may additionally include various other program modules that may include computer-executable instructions for supporting a variety of associated functionality. For example, the data storage 124 may include one or more fault location determination module(s) 132. The one or more fault location determination module(s) 132 may include computer-executable instructions that in response to execution by the one or more processors 120 cause operations to be performed including measuring electrical flow parameters of the transformer when the transformer is in an online mode. The operations to be performed may also include determining electrical flow parameters of the one or more windings from the measured electrical flow parameters of the transformer. The operations to be performed may also include determining a location of the fault in the one or more windings based at least on the determined electrical flow parameters.

In some embodiments, the operations to be performed may also include determining one or more electrical phasor values from the measured electrical flow parameters of the transformer. The operations to be performed may also include determining the electrical flow parameters of the one or more windings from the determined one or more electrical phasor values. The operations to be performed may also include determining one or more zero-sequence current values from the determined electrical flow parameters of the windings. The operations to be performed may also include comparing each of the one or more zero-sequence current values with one or more neutral current values of the one or more windings. The operations to be performed may also include determining the location of the fault based on the comparison. The operations to be performed may also include determining one or more phase-comparison voltage values and one or more phase-comparison current values by comparing the determined electrical flow parameters of the one or more windings. The operations to be performed may also include determining one or more excitation voltage values of the one or more windings from the determined one or more phase-comparison voltage values and one or more phase-comparison current values. The operations to be performed may also include determining one or more winding-comparison excitation voltage values by comparing the determined one or more excitation voltage values of the one or more windings. The operations to be performed may also include comparing the determined one or more winding-comparison excitation voltage values. The operations to be performed may also include determining in which of the one or more windings the fault is located based on the comparison of the one or more winding-comparison excitation voltage values. The operations to be performed may also include determining the location of the fault based on an equivalent circuit of the multi-phase transformer which represents voltage and current conditions in the one or more windings, impedances of the one or more windings, a transformer magnetizing impedance, and at least one of a phase to ground fault on the one or more windings or a phase to phase fault on the one or more windings. The operations to be performed may also include determining the voltage and current conditions from the determined electrical flow parameters of the one or more windings. The operations to be performed may also include determining the location of the fault based on an equivalent circuit of the single-phase transformer which represents voltage and current conditions in the one or more windings, impedances of the one or more windings, a transformer magnetizing impedance, and at least one of an inter-turn fault, a winding to winding fault, or a winding to ground fault on the one or more windings. The operations to be performed may also include determining the voltage and current conditions from the determined electrical flow parameters of the windings.

Within the data storage 124, one or more modules may be stored. As used herein, the term module may refer to a functional collection of instructions that may be executed by the one or more processors 120. For ease of description, and not by way of limitation, separate modules are described. However, it is understood that in some implementations the various functions provided by the modules may be merged, separated, and so forth. Furthermore, the modules may intercommunicate or otherwise interact with one another, such that the conditions of one affect the operation of another.

Those of skill in the art will appreciate that any of the components of the system 100 and associated architecture may include alternate and/or additional hardware, software, or firmware components beyond those described or depicted without departing from the scope of the disclosure. More particularly, it should be appreciated that hardware, software, or firmware components depicted or described as forming part of any of the illustrative components of the system 100, and the associated functionality that such components support, are merely illustrative and that some components may not be present or additional components may be provided in various embodiments. While various program modules have been depicted and described with respect to various illustrative components of the system 100, it should be appreciated that the functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of hardware, software, and/or firmware for implementing the functionality. Accordingly, it should be appreciated that the functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Further, while certain modules may be depicted and described as sub-modules of another module, in certain embodiments, such modules may be provided as independent modules.

Those of skill in the art will appreciate that the illustrative system 100 is provided by way of example only. Numerous other operating environments, system architectures, and device configurations are within the scope of this disclosure. Other embodiments of the disclosure may include fewer or greater numbers of components and/or devices and may incorporate some or all of the functionality described with respect to the illustrative system 100, or additional functionality.

Example Processes

Figure 2:
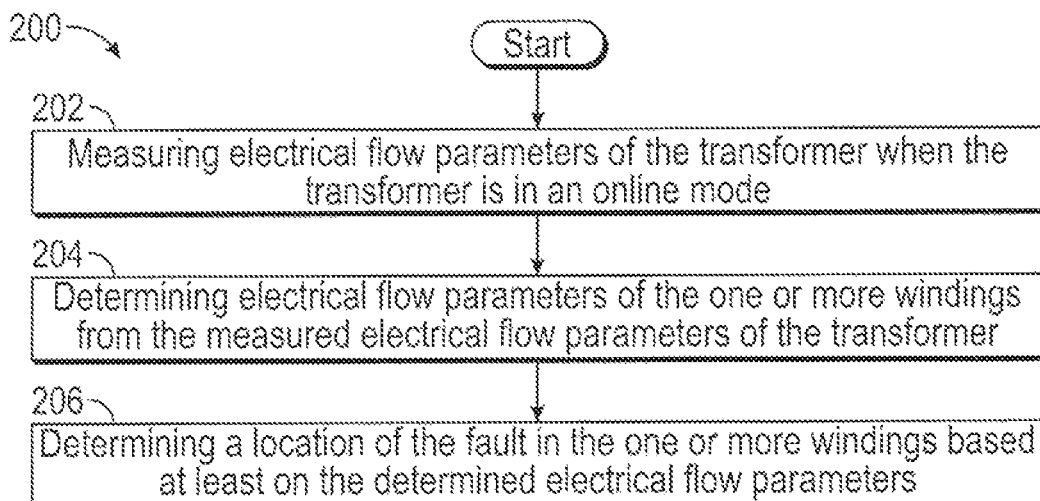
FIGS. 2-7 illustrate example flow diagrams of example processes in accordance with at least one embodiment of the disclosure.

FIG. 2 illustrates a flow diagram of an example process 200 in accordance with one or more embodiments of the disclosure. In some embodiments, the example process 200 may be performed locally or remotely, for example by the measurement device 104, the transformer fault detection servers 106, or the like.

In various embodiments, block 202 may involve the step of measuring electrical flow parameters of the transformer when the transformer is in an online mode.

In various embodiments, block 204 may involve the step of determining electrical flow parameters of the one or more windings from the measured electrical flow parameters of the transformer.

In various embodiments, block 206 may involve the step of determining a location of the fault in the one or more windings based at least on the determined electrical flow parameters.

Figure 3:
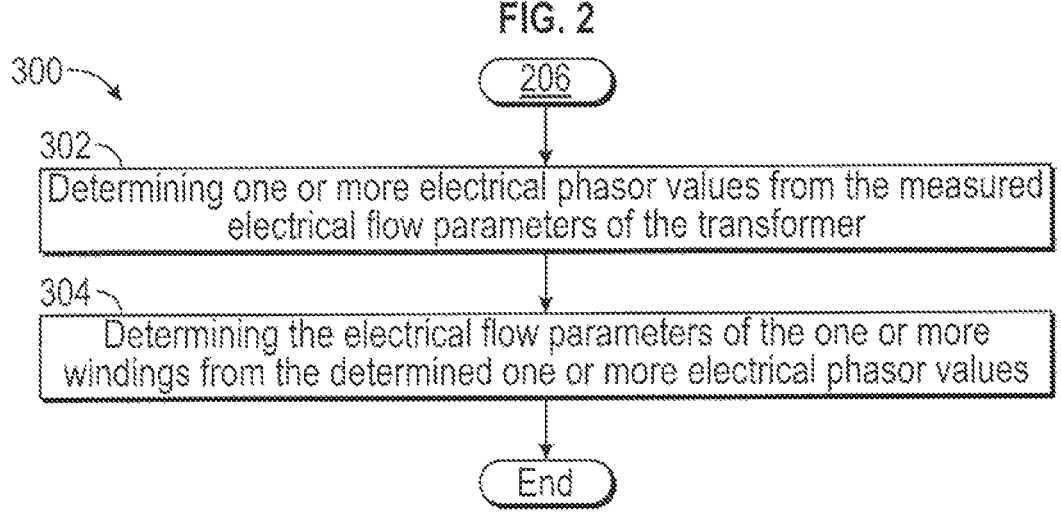

FIG. 3 illustrates a flow diagram of an example process 300 in accordance with one or more embodiments of the disclosure. Example process 300 may be a logical continuation of example process 200. In some embodiments, the example process 300 may be performed locally or remotely, for example by the measurement device 104, the transformer fault detection servers 106, or the like.

In various embodiments, block 302 may involve the operation of determining one or more electrical phasor values from the measured electrical flow parameters of the transformer.

In various embodiments, block 304 may involve the operation of determining the electrical flow parameters of the one or more windings from the determined one or more electrical phasor values.

Figure 4:
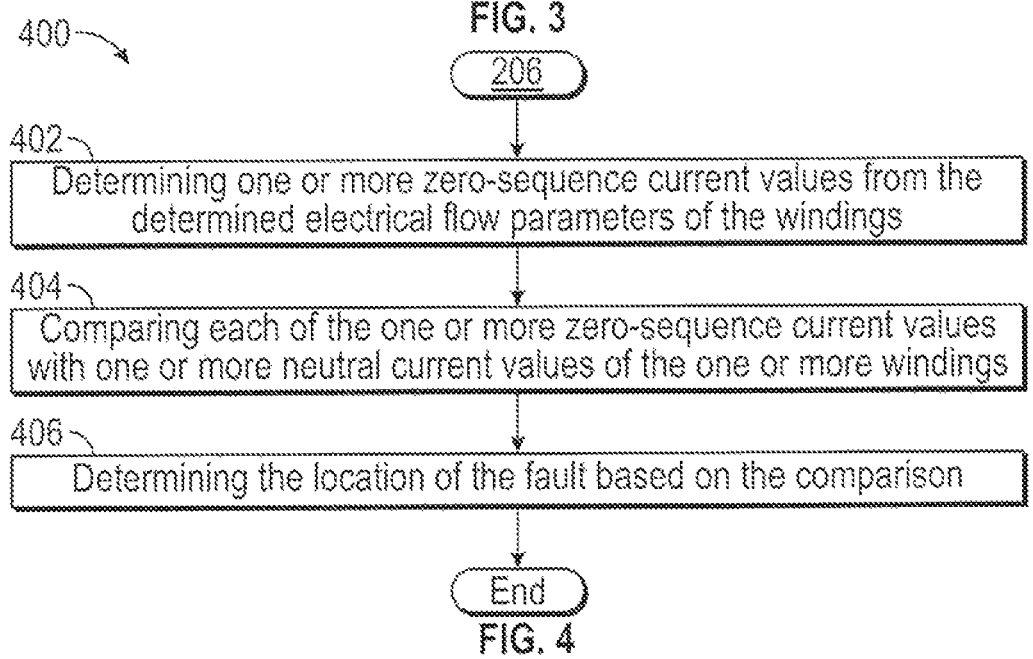

FIG. 4 illustrates a flow diagram of an example process 400 in accordance with one or more embodiments of the disclosure. Example process 400 may be a logical continuation of example process 200. In some embodiments, the example process 400 may be performed locally or remotely, for example by the measurement device 104, the transformer fault detection servers 106, or the like.

In various embodiments, block 402 may involve the operation of determining one or more zero-sequence current values from the determined electrical flow parameters of the windings.

In various embodiments, block 404 may involve the operation of comparing each of the one or more zero-sequence current values with one or more neutral current values of the one or more windings.

In various embodiments, block 406 may involve the operation of determining the location of the fault based on the comparison.

Figure 5:
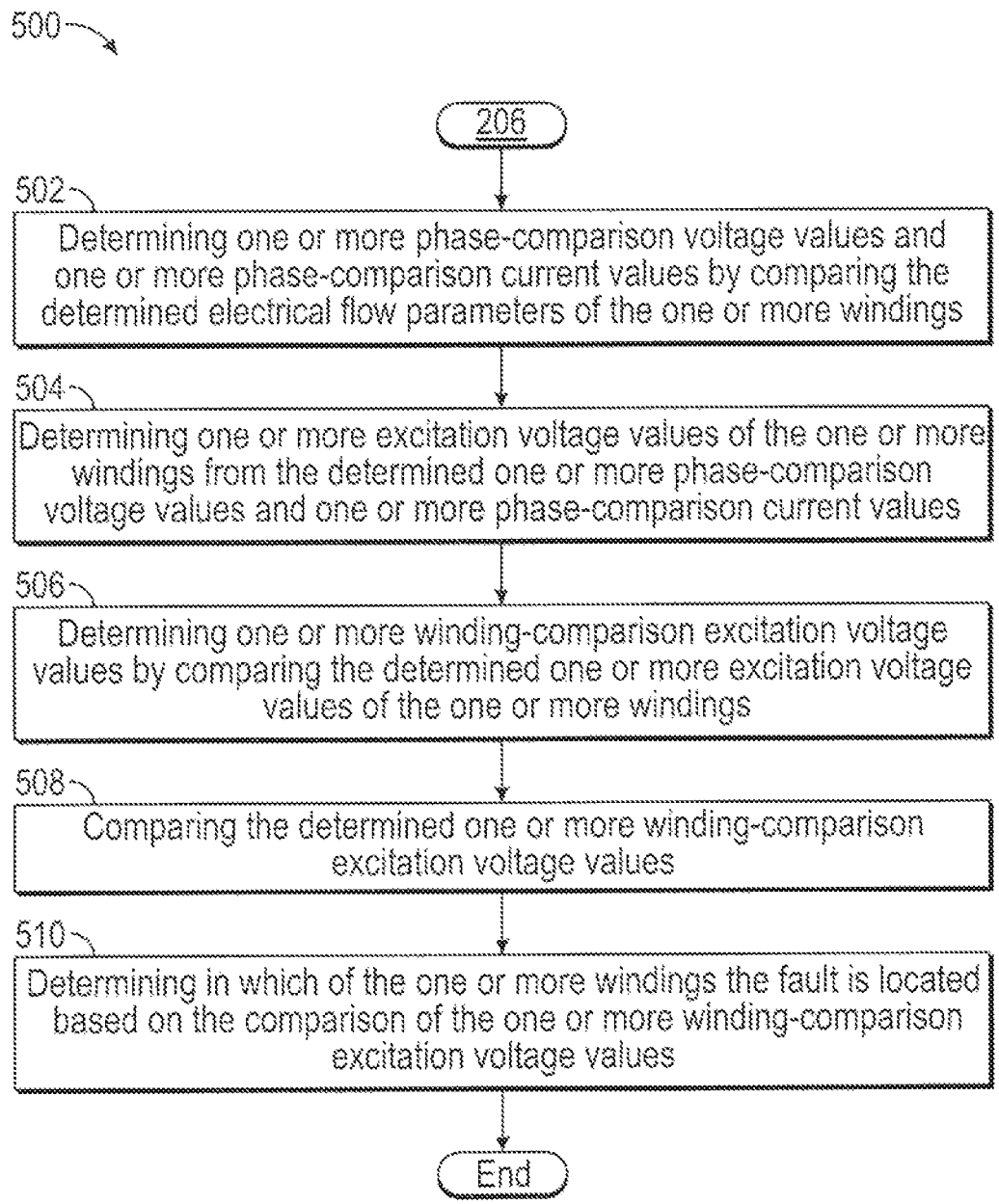

FIG. 5 illustrates a flow diagram of an example process 500 in accordance with one or more embodiments of the disclosure. Example process 500 may be a logical continuation of example process 200. In some embodiments, the example process 500 may be performed locally or remotely, for example by the measurement device 104, the transformer fault detection servers 106, or the like.

In various embodiments, block 502 may involve the operation of determining one or more phase-comparison voltage values and one or more phase-comparison current values by comparing the determined electrical flow parameters of the one or more windings.

In various embodiments, block 504 may involve the operation of determining one or more excitation voltage values of the one or more windings from the determined one or more phase-comparison voltage values and one or more phase-comparison current values.

In various embodiments, block 506 may involve the operation of determining one or more winding-comparison excitation voltage values by comparing the determined one or more excitation voltage values of the one or more windings.

In various embodiments, block 508 may involve the operation of comparing the determined one or more winding-comparison excitation voltage values In various embodiments, block 510 may involve the operation of determining in which of the one or more windings the fault is located based on the comparison of the one or more winding-comparison excitation voltage values.

Figure 6:
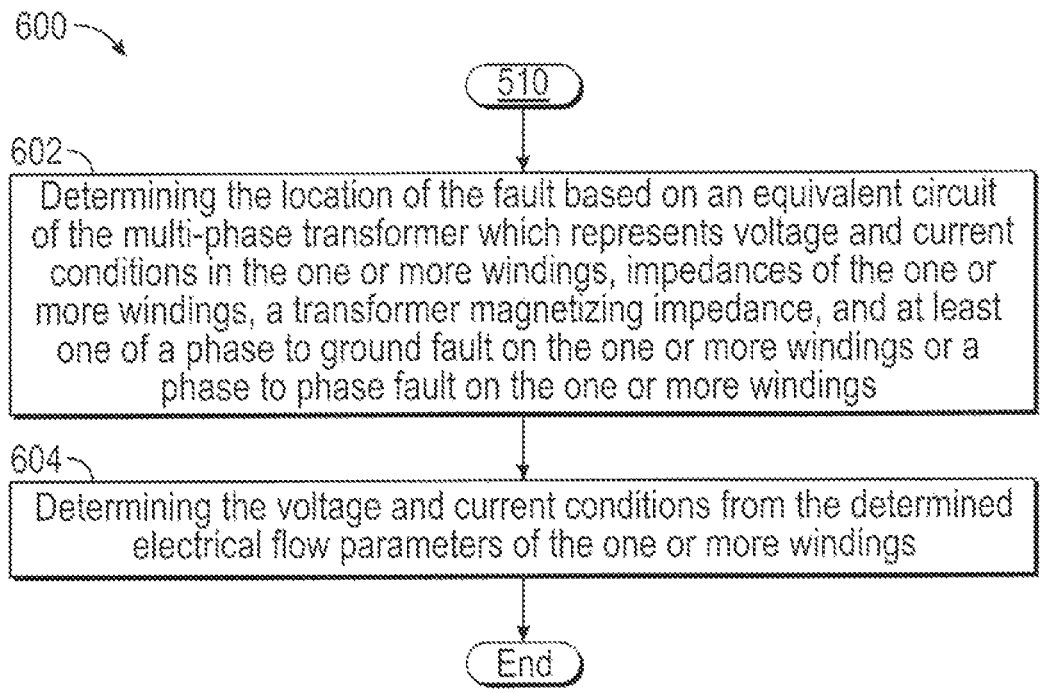

FIG. 6 illustrates a flow diagram of an example process 600 in accordance with one or more embodiments of the disclosure. Example process 600 may be a logical continuation of example process 200. In some embodiments, the example process 600 may be performed locally or remotely, for example by the measurement device 104, the transformer fault detection servers 106, or the like.

In various embodiments, block 602 may involve the operation of determining the location of the fault based on an equivalent circuit of the multi-phase transformer which represents voltage and current conditions in the one or more windings, impedances of the one or more windings, a transformer magnetizing impedance, and at least one of a phase to ground fault on the one or more windings or a phase to phase fault on the one or more windings.

In various embodiments, block 604 may involve the operation of determining the voltage and current conditions from the determined electrical flow parameters of the one or more windings.

Figure 7:
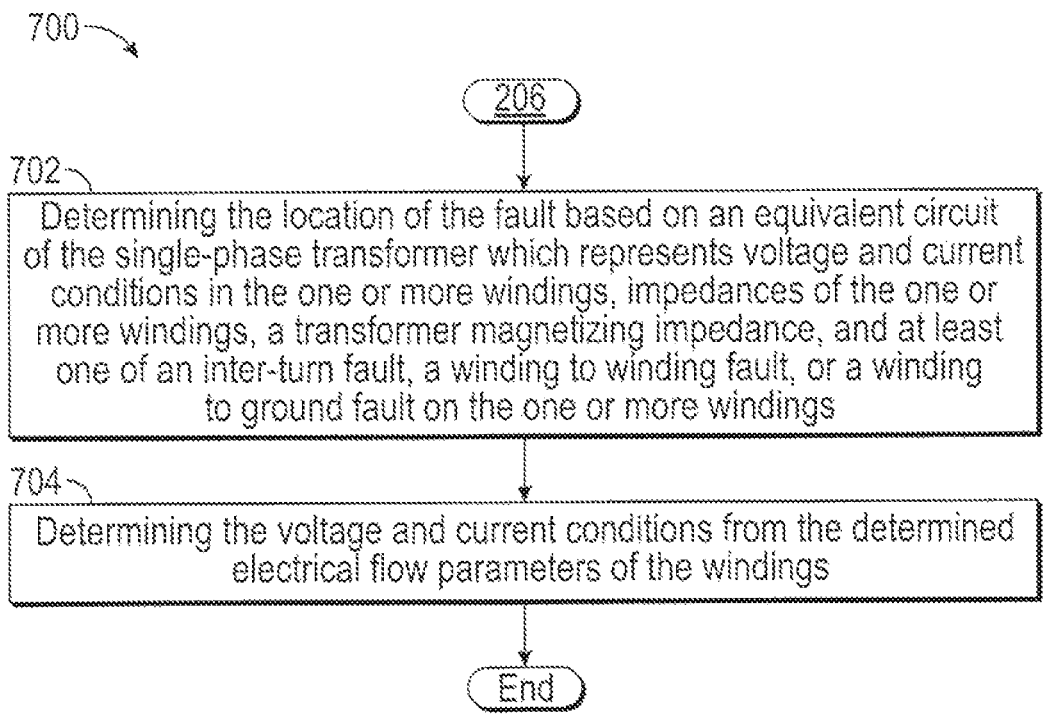

FIG. 7 illustrates a flow diagram of an example process 700 in accordance with one or more embodiments of the disclosure. Example process 700 may be a logical continuation of example process 200. In some embodiments, the example process 700 may be performed locally or remotely, for example by the measurement device 104, the transformer fault detection servers 106, or the like.

In various embodiments, block 702 may involve the operation of determining the location of the fault based on an equivalent circuit of the single-phase transformer which represents voltage and current conditions in the one or more windings, impedances of the one or more windings, a transformer magnetizing impedance, and at least one of an inter-turn fault, a winding to winding fault, or a winding to ground fault on the one or more windings.

In various embodiments, block 704 may involve the operation of determining the voltage and current conditions from the determined electrical flow parameters of the windings.

Various block and/or flow diagrams of systems, methods, apparatus, and/or computer program products according to example embodiments of the disclosure are described above. It will be understood that one or more blocks of the block diagrams and flow diagrams, and combinations of blocks in the block diagrams and flow diagrams, respectively, can be implemented by computer-readable program instructions. Likewise, some blocks of the block diagrams and flow diagrams may not necessarily need to be performed in the order presented, or may not necessarily need to be performed at all, according to some embodiments of the disclosure.

These computer-executable program instructions may be loaded onto a special purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the disclosure may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or operations to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or operations for performing the specified functions and program instruction means for performing the specified functions. It will also be understood that each block of the block diagrams and flow diagrams, and combinations of blocks in the block diagrams and flow diagrams, can be implemented by special purpose, hardware-based computer systems that perform the specified functions, elements or operations, or combinations of special purpose hardware and computer instructions.

Many modifications and other embodiments of the disclosure set forth herein will be apparent having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

Example Implementations

FIG. 8 shows schematically an illustrative block diagram 800 representative of an example fault location determination unit 802 for locating a fault in the windings of a three-phase transformer, which may be, for example, a two-winding or multi-winding (three or more winding) transformer. In some embodiments, the fault location determination unit 802 may include at least a first processing block 804, a second processing block 806, and a third processing block 808.

In some embodiments, voltage inputs $V_i^a$, $V_i^b$ and $V_i^c$ may be received by the fault location determination unit 802 and may be the measured three-phase voltages at terminals i (i=1, 2 or 3) of the transformer (which may correspond to the three phases of the transformer). Current inputs $I_i^a$, $I_i^b$ and $I_i^c$ may be received into the fault location determination unit 802 and may be the measured three-phase currents at terminals i (i=1, 2 or 3) of the transformer.

In some embodiments, a first input, $V_N$, into the fault location determination unit 802 may be the rated voltage at each terminal. A second input, WT, into the fault location determination unit 802 may indicate the type of each winding, where a value of '1' may indicate a grounded star ($Y_G$) type winding, '2' may indicate a star (Y) type winding, and '3' may indicate a delta (Δ) type winding, so that the vector of a $Y_G$/Y/Δ transformer may be [1,2,3]'. Third and fourth inputs, $R_T$ and $X_T$, into the fault location determination unit 802 may be transformer leakage resistance and reactance referred to the high-voltage side at each terminal, respectively. A fifth input, FP, into the fault location determination unit 802 may indicate which of the phases is the faulty phase; if the fault occurs on a phase, the elements that present the phase are '1', or that is '0', for example, when a phase-to-phase fault occurs on a phase A and a phase B, the vector may be [1,1,0]'.

In some embodiments, the fault location determination unit 802 may be configured to generate a faulty winding indicator, FW, which may be selected from the numbers '1', '2', '3', to indicate which of the windings is the faulty winding, and may also be configured to generate an output, x, to indicate the location of the fault within the faulty winding as a percentage of the length of the faulty winding from the top end of the faulty winding.

FIG. 9 provides an illustration of the first processing block 804 of the fault location determination unit 802. The first processing block 804 may be configured to perform data pre-processing, which in some instances may involve determining parameters such as voltages and currents of the transformer windings.

In some embodiments, the first processing block 804 may be configured to carry out a Discrete Fourier Transform at 902 of the various inputs 901, which may include voltage inputs $V_i^a$, $V_i^b$ and $V_i^c$ and the current inputs $I_i^a$, $I_i^b$ and $I_i^c$. The Discrete Fourier Transform may result in voltage and current phasors 908 respectively. This may be performed by the following equations:

$$\dot{I}_i^p(k) = \frac{2}{N}\sum_{m=0}^{N-1} I_i^p(k-m)e^{-j\frac{2\pi(k-m)}{N}}$$

$$\dot{U}_i^p(k) = \frac{2}{N}\sum_{m=0}^{N-1} U_i^p(k-m)e^{-j\frac{2\pi(k-m)}{N}}$$

where $\dot{I}_i^p(k)$ and $\dot{U}_i^p(k)$ may be phasor values of current and voltage respectively, the subscript i may denote the winding, i=1, 2, or 3, and the subscript p may denote the phase, p=a, b or c; N may be the number of samples per cycle, which can be set as, for example, 8, 16, 24, 32, 48, 64, 80 or 96 depending on the platform.

In some embodiments, following 902, all voltages phasors in the delta winding may undergo a delta-to-star transformation at 904 which may be performed by the following equations:
For a Δ1 winding, delta-to-star transformation may be made by the following equation.

$$\begin{bmatrix} \dot{V}^{a*} \\ \dot{V}^{b*} \\ \dot{V}^{c*} \end{bmatrix} = \begin{bmatrix} 1 & -1 & 0 \\ 0 & 1 & -1 \\ -1 & 0 & 1 \end{bmatrix} \begin{bmatrix} \dot{V}^a \\ \dot{V}^b \\ \dot{V}^c \end{bmatrix}$$

For a Δ11 winding, delta-to-star transformation may be made by the following equation.

$$\begin{bmatrix} \dot{V}^{a*} \\ \dot{V}^{b*} \\ \dot{V}^{c*} \end{bmatrix} = \begin{bmatrix} 1 & 0 & -1 \\ -1 & 1 & 0 \\ 0 & -1 & 1 \end{bmatrix} \begin{bmatrix} \dot{V}^a \\ \dot{V}^b \\ \dot{V}^c \end{bmatrix}$$

Where $\dot{V}^a$, $\dot{V}^b$, and $\dot{V}^c$ may be measured phase-to-ground voltage phasors; $\dot{V}^{a*}$, $\dot{V}^{b*}$, and $\dot{V}^{c*}$ may be voltages of the windings.

Voltage and current phasors 908 referred to high-voltage winding may be derived at 906 by the following equations:

$$\begin{bmatrix} \dot{V}^{a*} \\ \dot{V}^{b*} \\ \dot{V}^{c*} \end{bmatrix} = \frac{k_H U_{HN}}{k_L U_{LN}} \begin{bmatrix} \dot{V}^a \\ \dot{V}^b \\ \dot{V}^c \end{bmatrix}$$

$$\begin{bmatrix} \dot{I}^{a*} \\ \dot{I}^{b*} \\ \dot{I}^{c*} \end{bmatrix} = \frac{k_L U_{LN}}{k_H U_{HN}} \begin{bmatrix} \dot{I}^a \\ \dot{I}^b \\ \dot{I}^c \end{bmatrix}$$

Where $U_{HN}$ and $U_{LN}$ may be rated voltages in high-voltage winding and low-voltage winding, respectively; $k_H$ and $k_L$ may be ratio correction factor, if the winding type is $Y_G$ or Y, $k_H$(or $k_L$)=1; if the winding type is Δ, $k_H$(or $k_L$)=$\sqrt{3}$.

Figure 10:
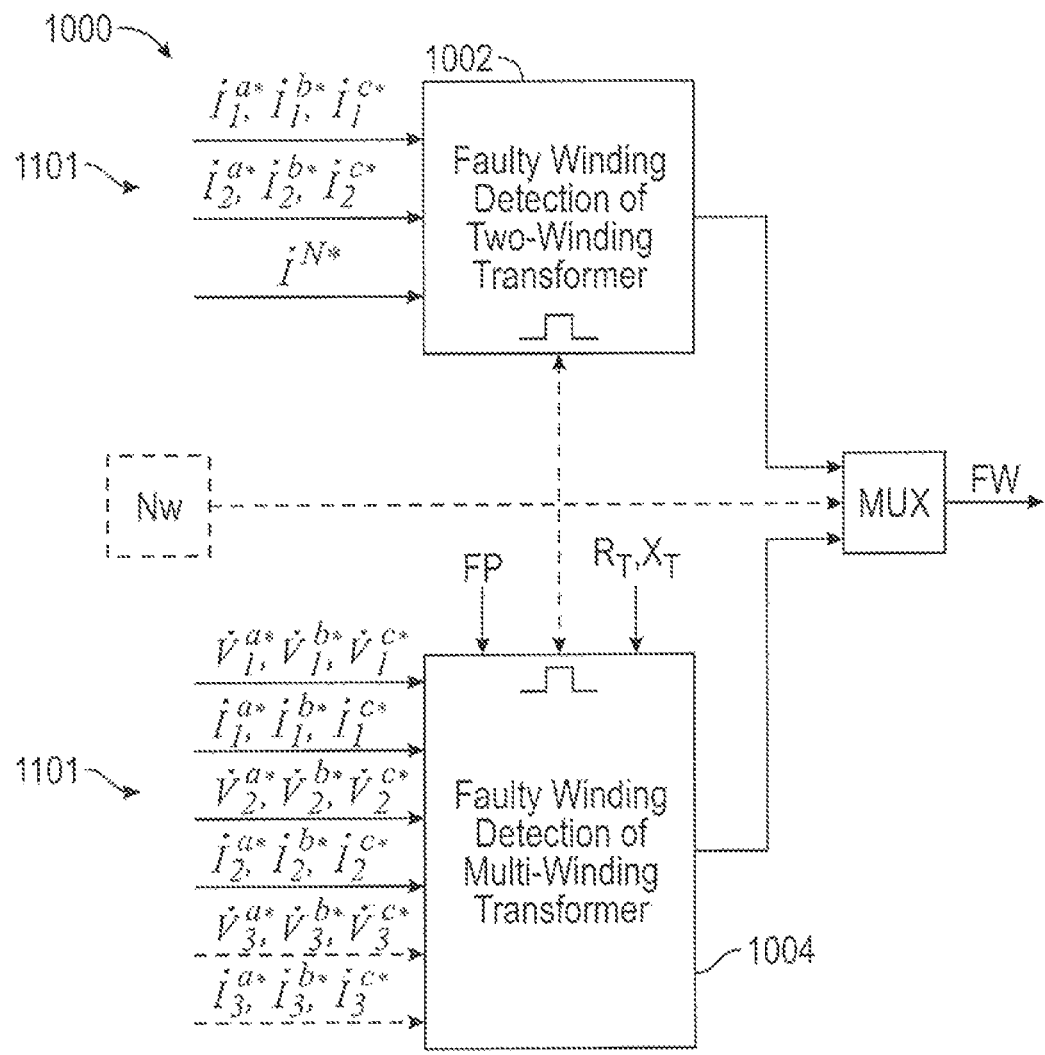

FIG. 10 provides an illustration of the second processing block 806 of the fault location determination unit 802. The second processing block 806 may be configured to perform a zero-sequence differential method to identify the faulty winding if the transformer is a two-winding transformer at 1002, and a voltage differential method to identify the faulty winding if the transformer is a multi-winding transformer at 1004. The second processing block 806 may receive inputs 1101, which may be the output current phasors 908 from FIG. 9. The second processing block 806 may then produce an output, which may be sent through a multiplexor to become FW.

Figure 11:
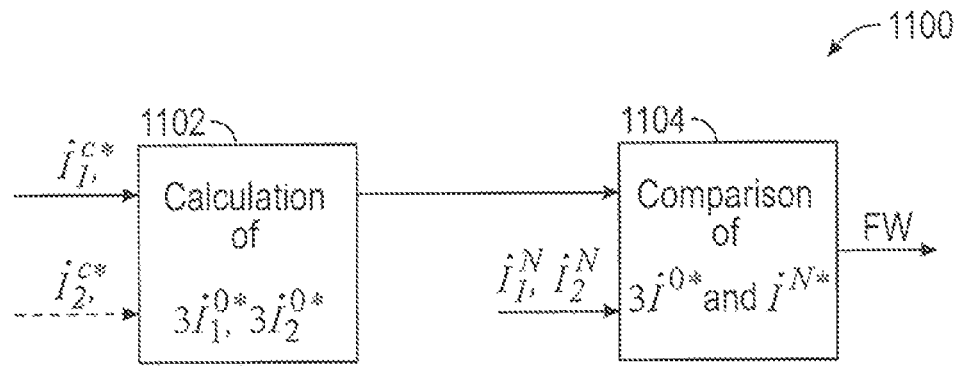

FIG. 11 shows schematically a processing block 1100 that may be used for the identification of the faulty winding using the zero-sequence differential method which uses the currents of the windings and neutral currents of the windings. FIG. 11 may represent 1002 of FIG. 10. The neutral point-to-ground currents $\dot{I}^{N*}$ of the windings may be obtained using measurement sensors for input into the fault location determination unit 802.

In some embodiments, the fault location determination unit 802 may be configured to determine first and second zero-sequence current values $3I_1^{0*}$, $3I_2^{0*}$ for a first and a second of the two windings respectively from the currents of the windings at 1102. If the transformer is a $Y_G\Delta$ transformer, the currents of the $Y_G$ winding may be used. If the transformer is a $Y_G Y_G$ transformer, the currents of all of the windings may be used. The first and second zero-sequence current values $3I_1^{0*}$, $3I_2^{0*}$ may be calculated as follows:

$$3\dot{I}^{0*} = \dot{I}^{a*} + \dot{I}^{b*} + \dot{I}^{c*}$$

Where $\dot{I}^{a*}$, $\dot{I}^{b*}$ and $\dot{I}^{c*}$ may be the currents of the $Y_G$ windings.

In some embodiments, this may be followed by comparing $3\dot{I}^{0*}$ and $\dot{I}^{N*}$ to detect the faulty winding of a $Y_G\Delta$ or $Y_G Y_G$ transformer at 1104. If the transformer is a $Y_G\Delta$ transformer, a criterion is set as the following equation.

$$\begin{cases} |3\dot{I}_1^{0*} - \dot{I}_1^N| \geq I^{set}, FW = 1 \\ |3\dot{I}_1^{0*} - \dot{I}_1^N| < I^{set}, FW = 2 \end{cases}$$

Where: $I^{set}$ is threshold setting current value; $\|\ \|$ is to calculate the modulus value.
If the transformer is a $Y_G Y_G$ transformer, $$\begin{cases} |3\dot{I}_1^{0*} - \dot{I}_1^N| \geq |3\dot{I}_2^{0*} - \dot{I}_2^N|, FW = 1 \\ |3\dot{I}_1^{0*} - \dot{I}_1^N| < |3\dot{I}_2^{0*} - \dot{I}_2^N|, FW = 2 \end{cases}$$

Figure 12:
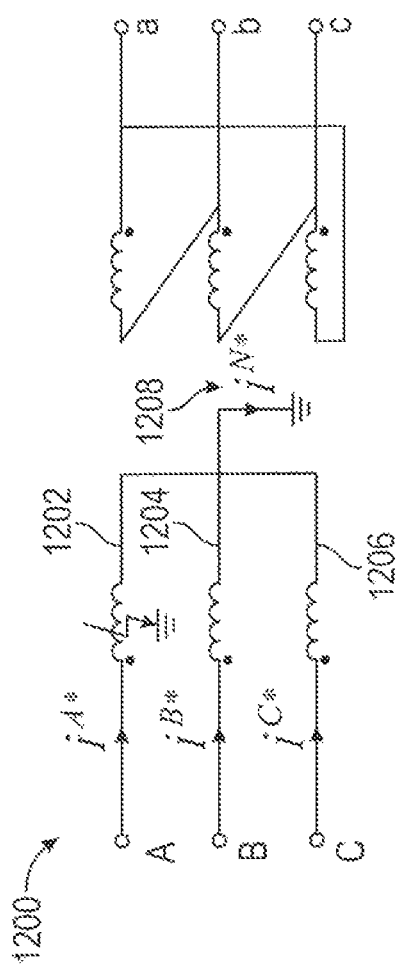

Where: $\|\ \|$ is to calculate the modulus value.
For the purposes of illustrating the zero-sequence differential method, the direction references of $\dot{I}^{a*}$ 1202, $\dot{I}^{b*}$ 1204 and $\dot{I}^{c*}$ 1206 and $\dot{I}^{N*}$ 1208 may be defined in the manner shown in FIG. 12.

Figure 13:
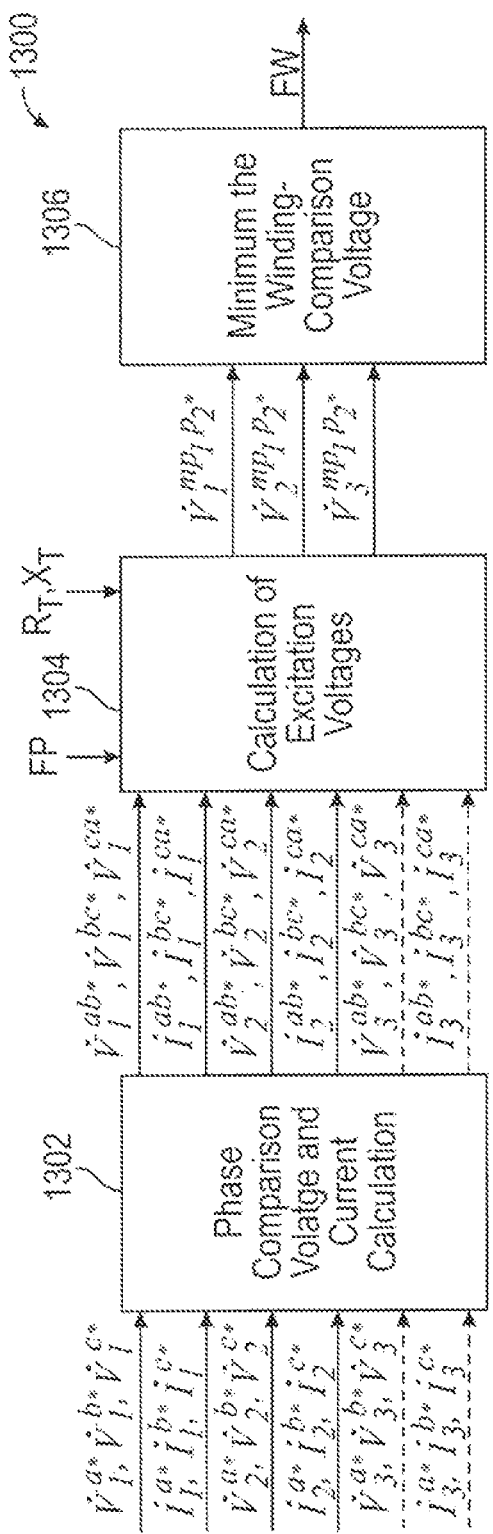

FIG. 13 shows schematically a processing block 1300 that may be used for the identification of the faulty winding using the voltage differential method which may use the voltages and currents of the windings. FIG. 13 may represent 1004 of FIG. 10.

In some embodiments, phase-comparison voltage values and phase-comparison current values may be obtained by comparing the voltages and currents of the windings at 1302, as follows. Phase-comparison voltages may be determined using the following equations:

$$\begin{bmatrix} \dot{V}_1^{ab*} \\ \dot{V}_1^{bc*} \\ \dot{V}_1^{ca*} \end{bmatrix} = \begin{bmatrix} 1 & -1 & 0 \\ 0 & 1 & -1 \\ -1 & 0 & 1 \end{bmatrix} \begin{bmatrix} \dot{V}_1^{a*} \\ \dot{V}_1^{b*} \\ \dot{V}_1^{c*} \end{bmatrix}$$

$$\begin{bmatrix} \dot{V}_2^{ab*} \\ \dot{V}_2^{bc*} \\ \dot{V}_2^{ca*} \end{bmatrix} = \begin{bmatrix} 1 & -1 & 0 \\ 0 & 1 & -1 \\ -1 & 0 & 1 \end{bmatrix} \begin{bmatrix} \dot{V}_2^{a*} \\ \dot{V}_2^{b*} \\ \dot{V}_2^{c*} \end{bmatrix}$$

$$\begin{bmatrix} \dot{V}_3^{ab*} \\ \dot{V}_3^{bc*} \\ \dot{V}_3^{ca*} \end{bmatrix} = \begin{bmatrix} 1 & -1 & 0 \\ 0 & 1 & -1 \\ -1 & 0 & 1 \end{bmatrix} \begin{bmatrix} \dot{V}_3^{a*} \\ \dot{V}_3^{b*} \\ \dot{V}_3^{c*} \end{bmatrix}$$

Phase-comparison currents may be calculated based on the winding type as follows. If the winding type is Y or $Y_G$, the equation used may be:

$$\begin{bmatrix} \dot{I}_Y^{ab*} \\ \dot{I}_Y^{bc*} \\ \dot{I}_Y^{ca*} \end{bmatrix} = \begin{bmatrix} 1 & -1 & 0 \\ 0 & 1 & -1 \\ -1 & 0 & 1 \end{bmatrix} \begin{bmatrix} \dot{I}_Y^{a*} \\ \dot{I}_Y^{b*} \\ \dot{I}_Y^{c*} \end{bmatrix}$$

If the winding type is Δ1, the equation used may be:

$$\begin{bmatrix} \dot{I}_\Delta^{ab*} \\ \dot{I}_\Delta^{bc*} \\ \dot{I}_\Delta^{ca*} \end{bmatrix} = \begin{bmatrix} 1 & 0 & 1 \\ 1 & 1 & 0 \\ 0 & 1 & 1 \end{bmatrix} \begin{bmatrix} \dot{I}_\Delta^{a*} \\ \dot{I}_\Delta^{b*} \\ \dot{I}_\Delta^{c*} \end{bmatrix}$$

If the winding type is Δ11, the equation used may be:

$$\begin{bmatrix} \dot{I}_\Delta^{ab*} \\ \dot{I}_\Delta^{bc*} \\ \dot{I}_\Delta^{ca*} \end{bmatrix} = \begin{bmatrix} 1 & 0 & 0 \\ 0 & 1 & 0 \\ 0 & 0 & 1 \end{bmatrix} \begin{bmatrix} \dot{I}_\Delta^{a*} \\ \dot{I}_\Delta^{b*} \\ \dot{I}_\Delta^{c*} \end{bmatrix}$$

In some embodiments, excitation voltage values of the windings may then be determined from the determined phase-comparison voltage values and phase-comparison current values at 1304, using the following equation:

$$\begin{bmatrix} \dot{V}_1^{mp_1p_2*} \\ \dot{V}_2^{mp_1p_2*} \\ \dot{V}_3^{mp_1p_2*} \end{bmatrix} = \begin{bmatrix} \dot{V}_1^{p_1p_2*} \\ \dot{V}_2^{p_1p_2*} \\ \dot{V}_3^{p_1p_2*} \end{bmatrix} - \begin{bmatrix} R_1+j\omega L_1 & 0 & 0 \\ 0 & R_2+j\omega L_2 & 0 \\ 0 & 0 & R_3+j\omega L_3 \end{bmatrix} \begin{bmatrix} \dot{I}_1^{p_1p_2*} \\ \dot{I}_2^{p_1p_2*} \\ \dot{I}_3^{p_1p_2*} \end{bmatrix}$$

Where: the subscripts $p_1$ and $p_2$ denote two phases, if phase-to-phase fault occurs, these two phases are faulty phases; if phase-to-ground fault occurs, one is faulty phase, the other is normal phase; the subscript m denotes the excitation; R and L are leakage resistance and inductance which are referred to high-voltage winding.

This may then be followed by determining the winding-comparison excitation voltage values by the following equations:

$$\begin{bmatrix} \dot{V}_{12}^{mp_1p_2*} \\ \dot{V}_{23}^{mp_1p_2*} \\ \dot{V}_{31}^{mp_1p_2*} \end{bmatrix} = \begin{bmatrix} \dot{V}_1^{mp_1p_2*} \\ \dot{V}_2^{mp_1p_2*} \\ \dot{V}_3^{mp_1p_2*} \end{bmatrix} - \begin{bmatrix} \dot{V}_2^{mp_1p_2*} \\ \dot{V}_3^{mp_1p_2*} \\ \dot{V}_1^{mp_1p_2*} \end{bmatrix}$$

In some embodiments, a final step may involve the determined winding-comparison excitation voltage values may be compared at 1306, so as to determine which of the windings is the location of the fault.

If $\dot{V}_{12}^{mp_1p_2*} = \min(\dot{V}_{12}^{mp_1p_2*}, \dot{V}_{23}^{mp_1p_2*}, \dot{V}_{31}^{mp_1p_2*})$, then the faulty winding may be winding 3.

If $\dot{V}_{23}^{mp_1p_2*} = \min(\dot{V}_{12}^{mp_1p_2*}, \dot{V}_{23}^{mp_1p_2*}, \dot{V}_{31}^{mp_1p_2*})$, then the faulty winding may be winding 1.

If $\dot{V}_{12}^{mp_1p_2*} = \min(\dot{V}_{12}^{mp_1p_2*}, \dot{V}_{23}^{mp_1p_2*}, \dot{V}_{31}^{mp_1p_2*})$, then the faulty winding may be winding 2. In some embodiments, the faulty winding value may be the same as FW.

Figure 14:
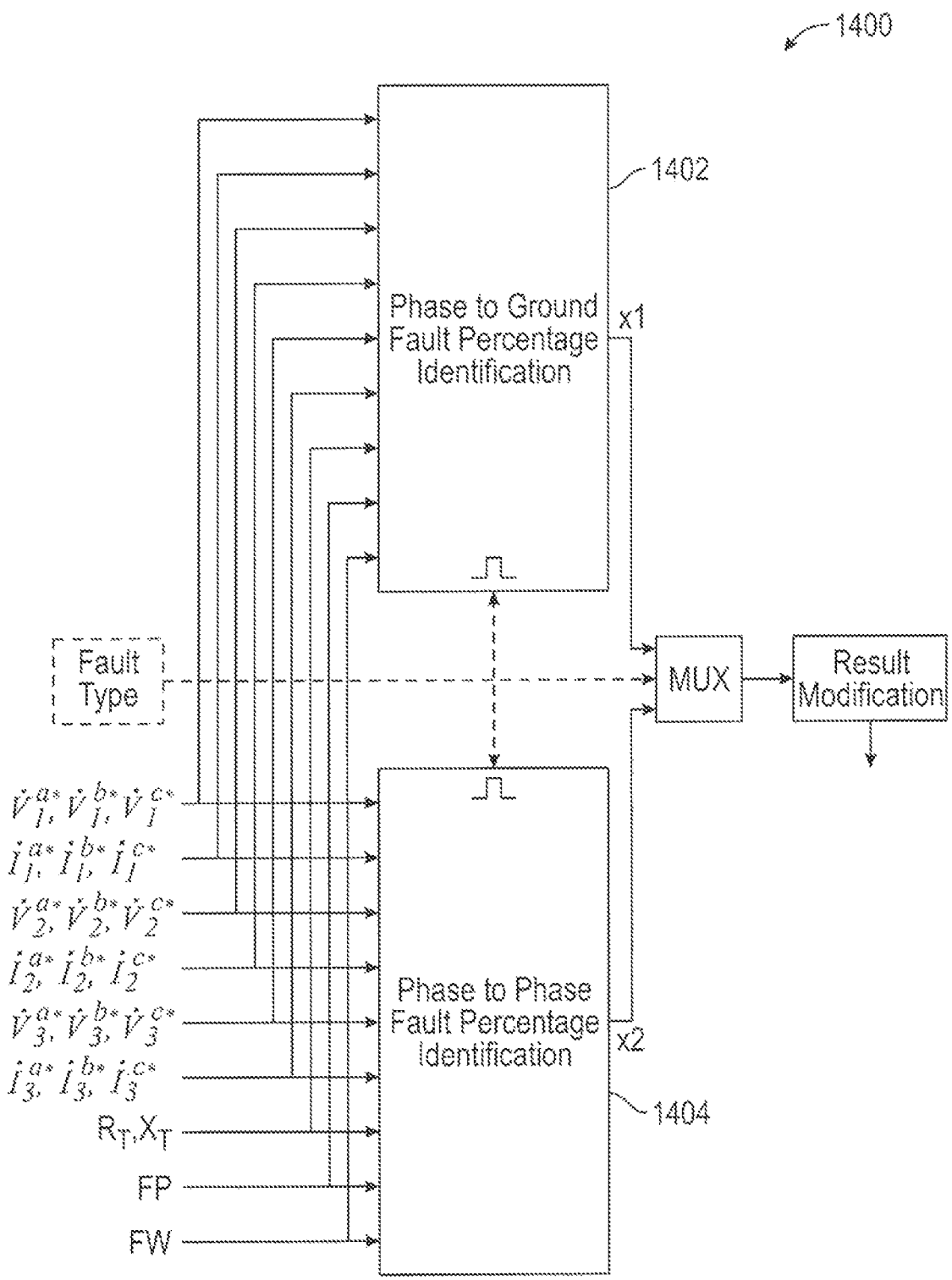

The third processing block 808 may be configured to carry out a third processing step of the fault location determination process to identify the location of the fault within the faulty winding. A block diagram representative of the third processing block 1400 is shown in FIG. 14.

The third processing block 808 may be configured to determine the location of the fault based on an equivalent circuit (for example, an equivalent circuit of FIG. 18, 20, or 22) of the three-phase transformer which may represent voltage and current conditions in the windings, impedances of the windings, transformer magnetizing impedance, transformer leakage resistance, and transformer leakage reactance. The equivalent circuit further may represent a phase to ground fault on the faulty winding 1402, or a phase to phase fault on the faulty winding 1404. The voltage and current conditions can be determined from the voltages and currents of the windings.

Figure 15:
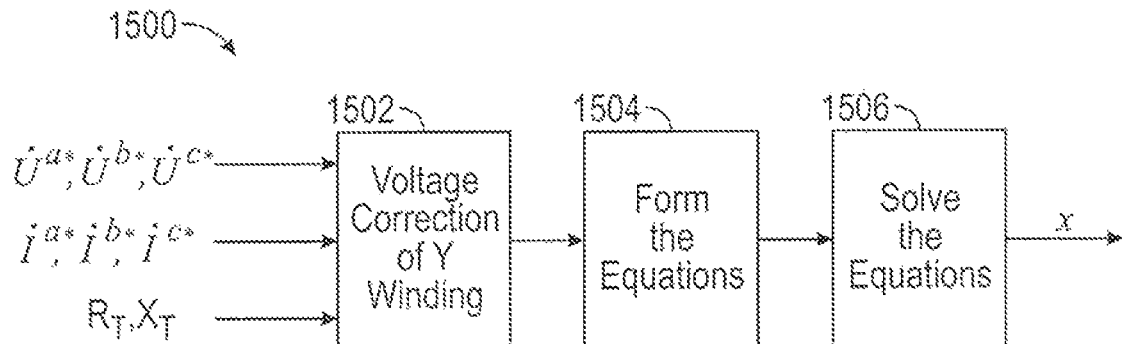
FIGS. 15 and 16 illustrate a fault location determination process using the fault location determination unit to locate a position of a fault within a faulty winding in accordance with at least one embodiment of the disclosure.
Figure 16:
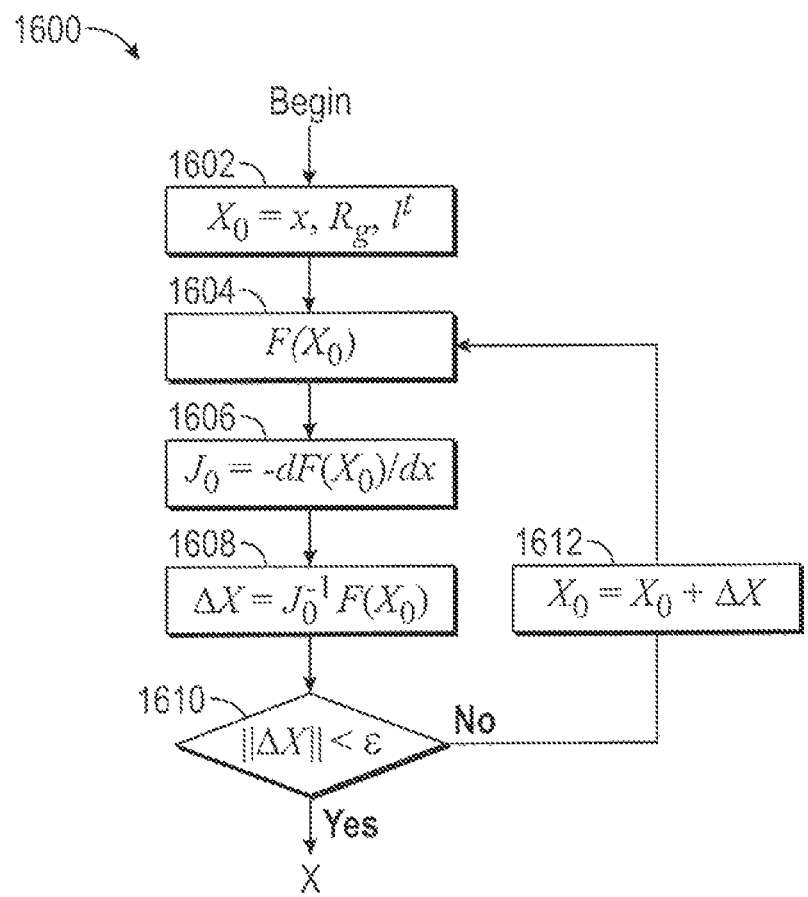

FIGS. 15 and 16 illustrate the determination of the location of the fault within the faulty winding in the event of a phase to ground fault on the faulty winding.

In some embodiments, if the phase-to-ground fault occurs on a Y winding, the three-phase voltages of the faulty winding may be corrected at 1502. If phase p is the faulty phase, the correction may be carried out so that $\dot{V}^{p**} = \dot{V}^{p*}$. If not, the correction may be carried out so that $\dot{V}^{p**} = \dot{V}^{p*} - \dot{V}^N$, where $\dot{V}^N$ is the neutral point to ground voltage as calculated by the following equation:

$$\dot{V}^N = \dot{V}_1^{p*} - \dot{I}_1^{p*}(R_1+j\omega L_1) - [\dot{V}_2^{p*} - \dot{I}_2^{p*}(R_2+j\omega L_2)]$$

If the phase-to-ground fault occurs on phase p (p=a, b, c), winding w (w=1, 2, 3), equations are established at 1504 as shown below.

$$\begin{cases} \dfrac{V_w^{p*} - R^g(\dot{I}_w^{p*} - \dot{I}^f)}{x} = (R_w+j\omega L_w)\dot{I}_w^{p*} + j(\omega L_m+\omega L_s)\left[x\dot{I}_w^{p*} + (1-x)\dot{I}^f + \sum_{k\in W}\dot{I}_k^{p*}\right] = \\ + j\omega L_m\left(\sum_{k\in W}\dot{I}_k^{p+1*} + \sum_{w\in W}\dot{I}_k^{p+2*}\right)(1-x)\dot{I}^f + \sum_{k\in W}\dot{I}_k^{p*} - \sum_{k\in W}\dot{I}_k^{p+1*} \end{cases}$$

$$\frac{\dot{V}_w^{p*} - \dot{V}_w^{p+1*} - (R_w + j\omega L_w)(\dot{I}_w^{p*} - \dot{I}_w^{p+1*})}{j\omega L_s}$$

Where, x may be the fault location percentage from the top of the faulty winding; $R^g$ may be the fault resistance; $\dot{I}^f$ may be fault current from the winding to ground; may be magnetizing impedance, which can be calculated from the nameplate value $I_0\%$; $L_s$ may be related to the number of limbs of the transformer 20, $L_s=-(N_{limb}-1)L_m$; the subscripts p, p+1 and p+2 may denote the fault, $2^{nd}$ and $3^{rd}$ phase; subscripts w, w+1 and w+2 may denote the fault, $2^{nd}$ winding and 3rd winding; W may be the set of all windings.

The equations may be solved by using the Newton-Raphson method at 1504 (Step 3.1.3), which is also illustrated in FIG. 16 at 1600 and may be performed as follows: (1) Give the initial value $X_0$ at 1602; (2) Calculate the $F(X_0)$ at the initial value at 1604; (3) perform Jacobi Matrix at $X_0$, $J_0=-dF(X_0)/dX_0$ at 1606; (4) Calculate the correction value, $\Delta X=J_0^{-1}F(X_0)$ at 1608; (5) determine if the $\Delta X$ satisfies $\|\Delta X\|<\varepsilon$; and (6) Modify the $X_0=X_0+\Delta X$, until $\Delta X$ satisfies the 1610 at 1612.

If the phase-to-phase fault occurs on Y or $Y_G$ winding, the value of x may be given by:

$$\frac{\dot{U}_w^{p*} - \dot{U}_w^{p+1*}}{(R_w + j\omega L_w)(\dot{I}_w^{p*} - \dot{I}_w^{p+1*}) + [\dot{U}_{w+1}^{p*} - (R_{w+1} + j\omega L_{w+1})\dot{I}_{w+1}^{p*}]} - \\ [\dot{U}_{w+1}^{p+1*} - (R_{w+1} + j\omega L_{w+1})\dot{I}_{w+1}^{p+1*}]$$

Where, the subscripts p, p+1 and p+2 denote the fault, $2^{nd}$ and $3^{rd}$ phase; subscripts w, w+1 and w+2 denote the fault, $2^{nd}$ winding and 3rd winding.

If the fault occurs on $\Delta 1$ winding, the value of x may be given by:

$$\frac{\dot{U}_w^{p*} - \dot{U}_w^{p+1*}}{(R_w + j\omega L_w)(\dot{I}_w^{p'} - \dot{I}_w^{p+1'}) + [\dot{U}_{w+1}^{p*} - (R_{w+1} + j\omega L_{w+1})\dot{I}_{w+1}^{p*}]} - \\ [\dot{U}_{w+1}^{p+1*} - (R_{w+1} + j\omega L_{w+1})\dot{I}_{w+1}^{p+1*}]$$

$$\dot{I}_w^{p'} - \dot{I}_w^{p+1'} = \dot{I}_w^{p*} - \dot{I}_w^{p+1*} - \dot{I}_w^{p+2*} + 3\frac{\dot{U}_w^{p+2*} - [\dot{U}_{w+1}^{p+2*} - (R_{w+1} + j\omega L_{w+1})\dot{I}_{w+1}^{p+2*}]}{R_w + j\omega L_w}$$

Where, subscripts w, w+1 and w+2 denote the fault, $2^{nd}$ winding and $3^{rd}$ winding.

If the fault occurs on $\Delta 1$ winding, the value of x may be given by:

$$\frac{\dot{U}_w^{p*} - \dot{U}_w^{p+1*}}{(R_w + j\omega L_w)(\dot{I}_w^{p'} - \dot{I}_w^{p+1'}) + [\dot{U}_{w+1}^{p*} - (R_{w+1} + j\omega L_{w+1})\dot{I}_{w+1}^{p*}]} - \\ [\dot{U}_{w+1}^{p+1*} - (R_{w+1} + j\omega L_{w+1})\dot{I}_{w+1}^{p+1*}]$$

$$\dot{I}_w^{p'} - \dot{I}_w^{p+1'} = \dot{I}_w^{p*} - \dot{I}_w^{p+1*} + \dot{I}_w^{p+2*} - 3\frac{\dot{U}_w^{p+2*} - [\dot{U}_{w+1}^{p+2*} - (R_{w+1} + j\omega L_{w+1})\dot{I}_{w+1}^{p+2*}]}{R_w + j\omega L_w}$$

Where, the subscripts p, p+1 and p+2 denote the fault, $2^{nd}$ and $3^{rd}$ phase; subscripts w, w+1 and w+2 denote the fault, $2^{nd}$ winding and 3rd winding. $\dot{I}_w^{p'}$ and $\dot{I}_w^{p+1'}$ are winding current of phase p and p+1, they are cannot be measured directly.

In some embodiments, the fault location determination unit 802 is therefore capable of locating a fault in a plurality of windings of a three-phase transformer by using voltages and currents measured at the terminals of the transformer when the transformer may be in an online mode under the fault conditions.

It will be appreciated that the foregoing fault location determination process may apply mutatis mutandis to a fault location determination process for locating a fault in a plurality of windings of a transformer with a different number of multiple phases.

In some embodiments, the fault location determination unit 802 may be configured for locating a fault in a pair of windings of a single-phase transformer. More particularly, such a fault location determination unit 802 may be configured to determine the location of the fault based on an equivalent circuit of the single-phase transformer which represents voltage and current conditions in the windings, impedances of the windings, and transformer magnetizing impedance. The equivalent circuit further represents an inter-turn fault on one of the windings, a winding to winding fault, or a winding to winding to ground fault. The voltage and current conditions can be determined from the voltages and currents of the windings.

Figure 17:
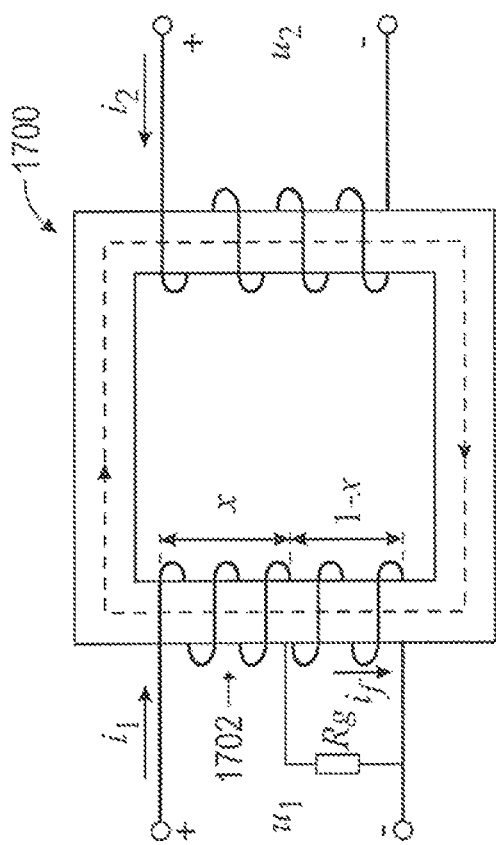
FIG. 17 shows schematically a single-phase transformer with an inter-turn fault in accordance with at least one embodiment of the disclosure.

FIG. 17 shows schematically the single-phase transformer 1700 with the inter-turn fault 1702 on one of its windings, where the inter-turn fault 1702 is a winding to ground fault with a fault resistance $R_g$. The location of the inter-turn fault 1702 within the faulty winding may correspond to a fraction, x, of the length of the faulty winding from the top end of the faulty winding.

Figure 18:
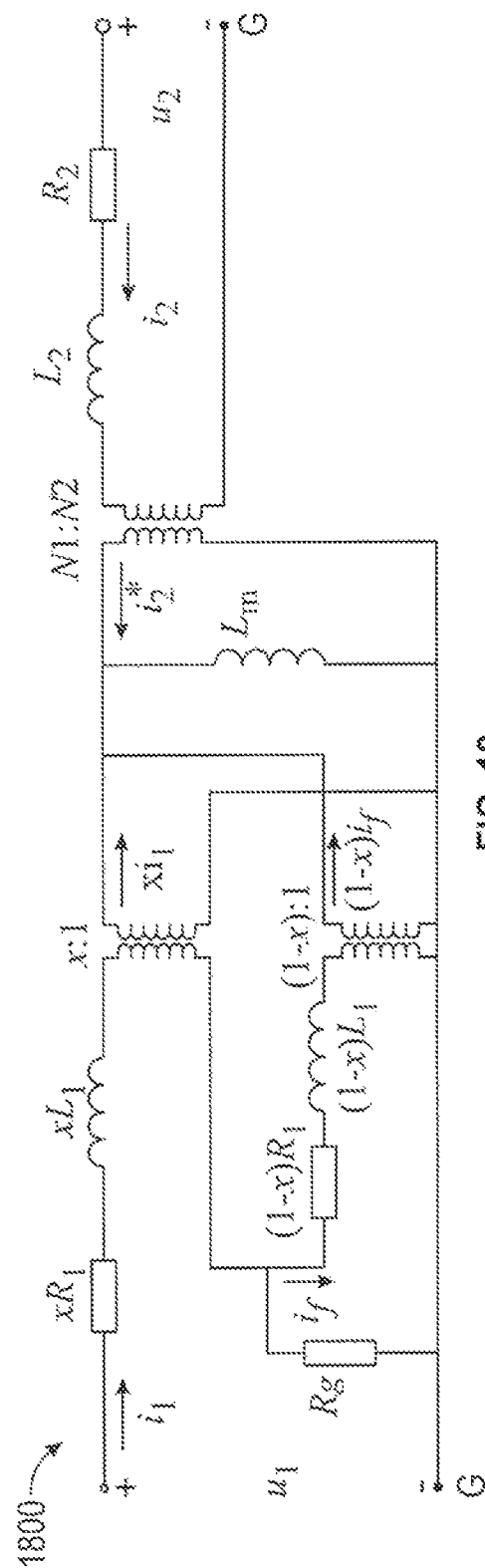
FIG. 18 shows schematically an equivalent circuit of the single-phase transformer of FIG. 17 in accordance with at least one embodiment of the disclosure.

FIG. 18 shows the equivalent circuit 1800 of the single-phase transformer 1700 of FIG. 17. The equivalent circuit 1800 in FIG. 18 is given by the following equation:

$$\begin{bmatrix} \frac{\dot{U}_1 - R_g(\dot{I}_1 - \dot{I}_f)}{x} \\ \frac{R_g(\dot{I}_1 - \dot{I}_f)}{x} \\ \dot{U}_2^* \end{bmatrix} = \begin{bmatrix} R_1 + j\omega L_1 & 0 & 0 \\ 0 & R_1 + j\omega L_1 & 0 \\ 0 & 0 & R_2^* + j\omega L_2^* \end{bmatrix} \begin{bmatrix} \dot{I}_1 \\ \dot{I}_f \\ \dot{I}_2^* \end{bmatrix} + \\ j\omega \begin{bmatrix} L_m & L_m & L_m \\ L_m & L_m & L_m \\ L_m & L_m & L_m \end{bmatrix} \begin{bmatrix} x\dot{I}_1 \\ (1-x)\dot{I}_f \\ \dot{I}_2^* \end{bmatrix}$$

Where $\dot{U}_2^*$ and $\dot{I}_2^*$ are voltage and current referred to the primary winding, $\dot{U}_2^*=(N_1/N_2)\dot{U}_2$, $\dot{I}_2^*=(N_2/N_1)\dot{I}_2$; $R_2^*$ and $L_2^*$ are resistance and inductance referred to the primary winding, $R_2^*=(N_1/N_2)^2R_2$, $L_2^*=(N_1/N_2)^2L_2$.

The voltages $U_1$, $U_2$ and currents $I_1$, $I_2$ of the windings may be calculated from the measured voltages and currents at the terminals of the single-phase transformer 1700. The above equation can be solved to obtain the values of the variables x, $R_g$ and $i_f$, where $i_f$ is the fault current in the winding to ground fault.

Figure 19:
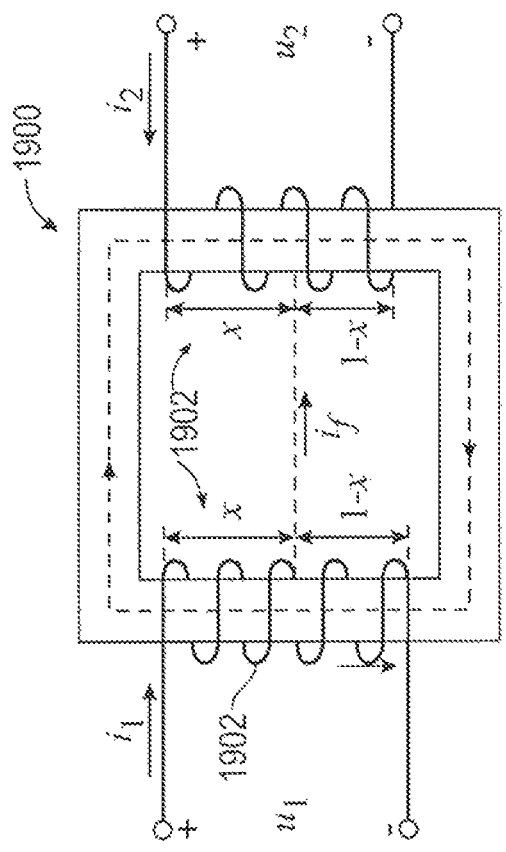
FIG. 19 shows schematically the single-phase transformer with a winding to winding fault in accordance with at least one embodiment of the disclosure.

FIG. 19 shows schematically the single-phase transformer with the winding to winding fault 1902. The location of the winding to winding fault 1902 may correspond to a fraction, x, of the length of each winding from the top end of each winding.

Figure 20:
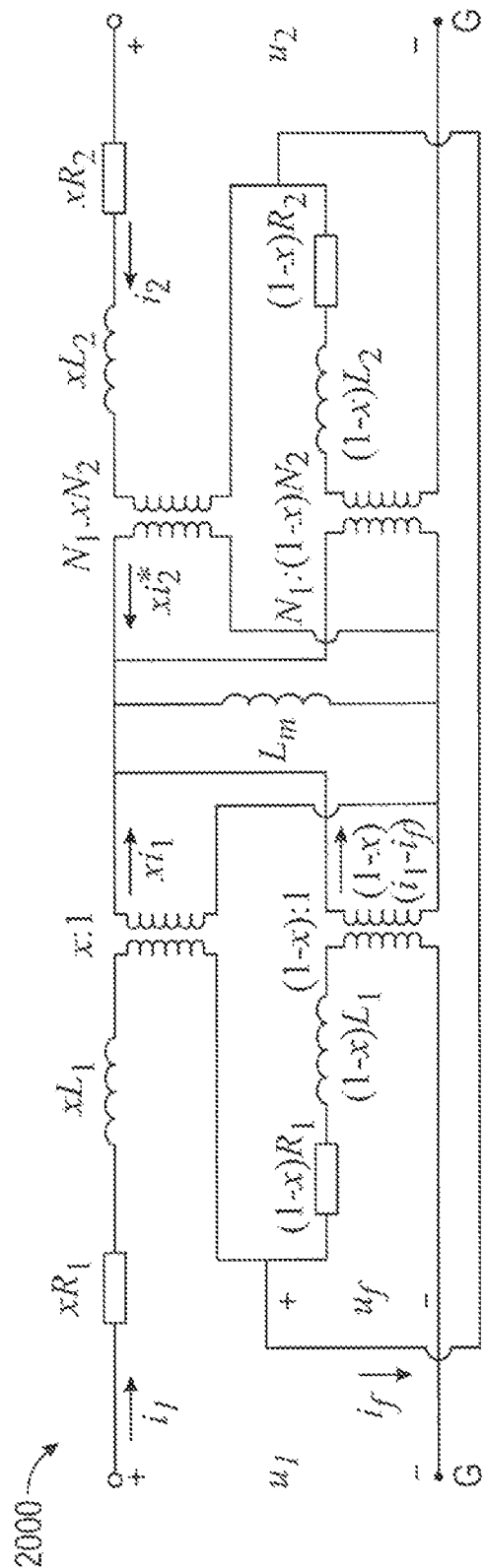
FIG. 20 shows schematically an equivalent circuit of the single-phase transformer of FIG. 19 in accordance with at least one embodiment of the disclosure.

FIG. 20 shows the equivalent circuit 2000 of the single-phase transformer 1900 of FIG. 19. The equivalent circuit 2000 in FIG. 20 may be given by the following equation:

$$\begin{bmatrix} \dfrac{\dot{U}_1 - \dot{U}_f}{x} \\ \dfrac{\dot{U}_f}{1-x} \\ \dfrac{\dot{U}_2^* - \dot{U}_f^*}{x} \end{bmatrix} = \begin{bmatrix} R_1 + j\omega L_1 & 0 & 0 \\ 0 & R_1 + j\omega L_1 & 0 \\ 0 & 0 & R_2^* + j\omega L_2^* \end{bmatrix} \begin{bmatrix} \dot{I}_1 \\ \dot{I}_1 - \dot{I}_f \\ \dot{I}_2^* \end{bmatrix} +$$

$$j\omega \begin{bmatrix} L_m & L_m & L_m \\ L_m & L_m & L_m \\ L_m & L_m & L_m \end{bmatrix} \begin{bmatrix} x\dot{I}_1 \\ (1-x)(\dot{I}_1 - \dot{I}_f) \\ x\dot{I}_2^* \end{bmatrix}$$

Where $\dot{U}_2^*$ and $\dot{I}_2^*$ are secondary winding voltage and current referred to primary winding: $\dot{U}_2^* = (N_1/N_2)\dot{U}_2$, $\dot{I}_2^* = (N_2/N_1)\dot{I}_2$; $R_2^*$ and $L_2^*$ are secondary winding resistance and inductance referred to the primary winding: $R_2^* = (N_1/N_2)^2 R_2$, $L_2^* = (N_1/N_2)^2 L_2$; $\dot{U}_f^*$ is fault voltage referred into primary winding, $\dot{U}_f^* = (N_1/N_2)\dot{U}_f$.

Again, the voltages $U_1$, $U_2$ and currents $I_1$, $I_2$ of the windings may be calculated from the measured voltages and currents at the terminals of the single-phase transformer 1900. The above equation can be solved to obtain the values of the variables x, $i_f$ and $U_f$. In this case the fault current if flows between the two windings.

Figure 21:
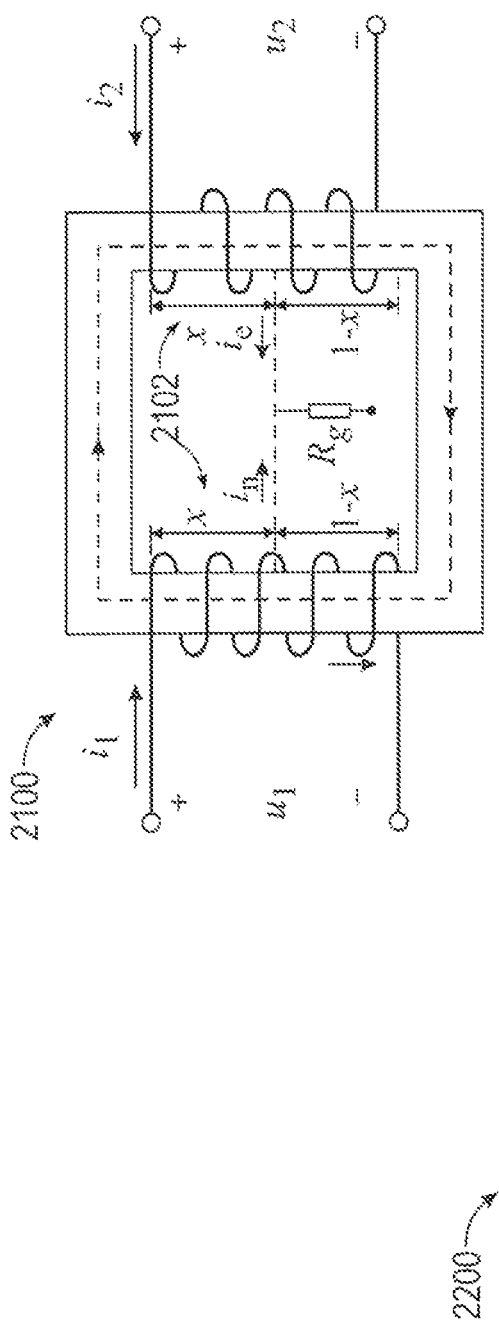
FIG. 21 shows schematically the single-phase transformer with a winding to winding to ground fault in accordance with at least one embodiment of the disclosure.

FIG. 21 shows schematically the single-phase transformer 2100 with the winding to winding to ground fault 2102. The location of the winding to winding to ground fault 2102 corresponds to a fraction, x, of the length of each winding from the top end of each winding.

Figure 22:
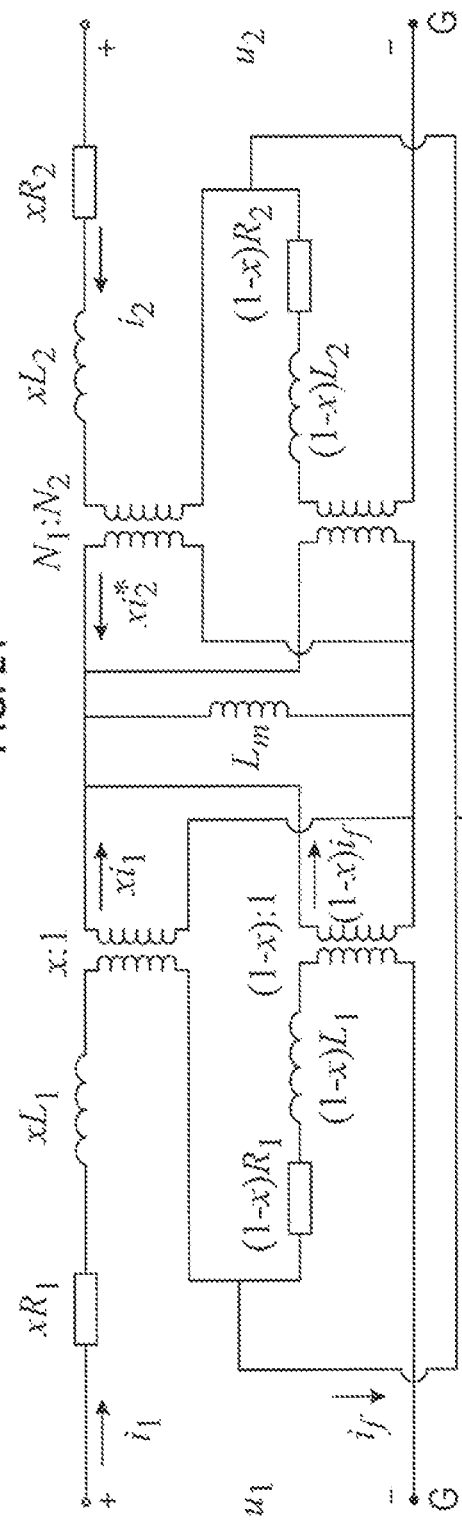
FIG. 22 shows schematically an equivalent circuit of the single-phase transformer of FIG. 21 in accordance with at least one embodiment of the disclosure.

FIG. 22 shows the equivalent circuit 2200 of the single-phase transformer 2100 of FIG. 21. The equivalent circuit 2200 in FIG. 20 is given by the following equation:

$$\begin{bmatrix} \dfrac{\dot{U}_1 - \dot{U}_f}{x} \\ \dfrac{\dot{U}_f}{1-x} \\ \dfrac{\dot{U}_2^* - \dot{U}_f^*}{x} \end{bmatrix} = \begin{bmatrix} R_1 + j\omega L_1 & 0 & 0 \\ 0 & R_1 + j\omega L_1 & 0 \\ 0 & 0 & R_2^* + j\omega L_2^* \end{bmatrix} \begin{bmatrix} \dot{I}_1 \\ \dot{I}_1 - \dot{I}_{f1} \\ \dot{I}_2^* \end{bmatrix} +$$

$$j\omega \begin{bmatrix} L_m & L_m & L_m \\ L_m & L_m & L_m \\ L_m & L_m & L_m \end{bmatrix} \begin{bmatrix} x\dot{I}_1 \\ (1-x)\dot{I}_1 - \dot{I}_{f1} \\ x\dot{I}_2^* \end{bmatrix}$$

Again, the voltages $U_1$, $U_2$ and currents $I_1$, $I_2$ of the windings may be calculated from the measured voltages and currents at the terminals of the single-phase transformer. The above equation can be solved to obtain the values of the variables x, $i_{f1}$, $i_{f2}$ and $U_f$. In this case each of the fault currents $i_{f1}$, $i_{f2}$ flow to ground from each of the primary and secondary windings respectively.

In some embodiments, the fault location determination unit 802 is therefore capable of locating a fault in a plurality of windings of a single-phase transformer by using voltages and currents measured at the terminals of the transformer when the transformer is in an online mode under the fault conditions. Such a fault may include, for example, a pre-empt fault which is an initial intermittent high impedance short circuit fault preceding a severe short circuit fault.

It will also be appreciated that the disclosure is exemplarily described above with reference to the use of measured voltages and currents at three terminals of the transformer 20, and the disclosure applies mutatis mutandis to measured voltages and currents at more than three terminals of the transformer 20, such as four or five terminals of the transformer 20.

The invention claimed is:

1. A system for locating a fault in one or more windings of a transformer, the system comprising:
  a measurement device configured to measure electrical flow parameters of the transformer when the transformer is in an online mode; and
  a fault location determination unit configured to determine electrical flow parameters of the one or more windings of the transformer based at least on the measured electrical flow parameters of the transformer, wherein the fault location determination unit is further configured to determine, based at least on the determined electrical flow parameters, a location of the fault in a first winding of the one or more windings, a phase of the fault, and a percentage of the first winding on which the fault exists.

2. The system of claim 1, wherein determining the location of the fault in the one or more windings includes determining in which of the one or more windings the fault is located.

3. The system of claim 2, wherein determining the location of the fault in the one or more windings further includes determining in which of a plurality of turns of the one or more windings the fault is located.

4. The system of claim 1, wherein the transformer is a multi-phase transformer, and wherein the fault location determination unit is further configured to determine one or more electrical phasor values from the measured electrical flow parameters of the transformer, and wherein the fault location determination unit is further configured to determine the electrical flow parameters of the one or more windings from the determined one or more electrical phasor values.

5. The system of claim 1, wherein the fault location determination unit is further configured to determine one or more zero-sequence current values from the determined electrical flow parameters of the one or more windings, and wherein the fault location determination unit is further configured to compare each of the one or more zero-sequence current values with one or more neutral current values of the one or more windings, and wherein the fault location determination unit is further configured to determine the location of the fault based on the comparison.

6. The system of claim 1 wherein the fault location determination unit is further configured to:
  determine one or more phase-comparison voltage values and one or more phase-comparison current values by comparing the determined electrical flow parameters of the one or more windings;

determine one or more excitation voltage values of the one or more windings from the determined one or more phase-comparison voltage values and one or more phase-comparison current values;
determine one or more winding-comparison excitation voltage values by comparing the determined one or more excitation voltage values of the one or more windings;
compare the determined one or more winding-comparison excitation voltage values; and
determine in which of the one or more windings the fault is located based on the comparison of the one or more winding-comparison excitation voltage values.

7. The system of claim 1, wherein the transformer is a multi-phase transformer, and wherein the fault location determination unit is further configured to determine the location of the fault based on an equivalent circuit of the multi-phase transformer which represents voltage and current conditions in the one or more windings, impedances of the one or more windings, a transformer magnetizing impedance, and at least one of a phase to ground fault on the one or more windings or a phase to phase fault on the one or more windings, and wherein the fault location determination unit is further configured to determine the voltage and current conditions from the determined electrical flow parameters of the one or more windings.

8. The system of claim 7 wherein the equivalent circuit of the multi-phase transformer further represents at least one of a transformer leakage resistance or a transformer leakage reactance.

9. The system of claim 1, wherein the transformer is a single-phase transformer, and wherein the fault location determination unit is further configured to determine the location of the fault based on an equivalent circuit of the single-phase transformer which represents voltage and current conditions in the one or more windings, impedances of the one or more windings, a transformer magnetizing impedance, and an inter-turn fault on the one or more windings, and wherein the fault location determination unit is further configured to determine the voltage and current conditions from the determined electrical flow parameters of the windings.

10. The system of claim 1, wherein the transformer is a single-phase transformer, and the fault location determination unit is further configured to determine the location of the fault based on an equivalent circuit of the single-phase transformer which represents voltage and current conditions in the one or more windings, impedances of the one or more windings, a transformer magnetizing impedance, and a winding to winding fault between the one or more windings, and wherein the fault location determination unit is further configured to determine the voltage and current conditions from the determined electrical flow parameters of the windings.

11. The system of claim 1, wherein the transformer is a single-phase transformer, and the fault location determination unit is further configured to determine the location of the fault based on an equivalent circuit of the single-phase transformer which represents voltage and current conditions in the one or more windings, impedances of the one or more windings, a transformer magnetizing impedance, and a winding to ground fault the one or more windings, and wherein the fault location determination unit is further configured to determine the voltage and current conditions from the determined electrical flow parameters of the windings.

12. A method of locating a fault in one or more windings of a transformer, the method comprising:
measuring electrical flow parameters of the transformer when the transformer is in an online mode;
determining electrical flow parameters of the one or more windings from the measured electrical flow parameters of the transformer; and
determining, based at least on the determined electrical flow parameters, a location of the fault in a first winding of the one or more windings, a phase of the fault, and a percentage of the first winding on which the fault exists.

13. The method of claim 12, wherein determining the location of the fault in the one or more windings includes determining in which of the one or more windings the fault is located.

14. The method of claim 12, wherein determining the location of the fault in the one or more windings further includes determining in which of a plurality of turns of the one or more windings the fault is located.

15. The method of claim 12, wherein the transformer is a multi-phase transformer, the method further comprising:
determining one or more electrical phasor values from the measured electrical flow parameters of the transformer; and
determining the electrical flow parameters of the one or more windings from the determined one or more electrical phasor values.

16. The method of claim 12, further comprising:
determining one or more zero-sequence current values from the determined electrical flow parameters of the windings;
comparing each of the one or more zero-sequence current values with one or more neutral current values of the one or more windings; and
determining the location of the fault based on the comparison.

17. The method of claim 12, further comprising:
determining one or more phase-comparison voltage values and one or more phase-comparison current values by comparing the determined electrical flow parameters of the one or more windings;
determining one or more excitation voltage values of the one or more windings from the determined one or more phase-comparison voltage values and one or more phase-comparison current values;
determining one or more winding-comparison excitation voltage values by comparing the determined one or more excitation voltage values of the one or more windings;
comparing the determined one or more winding-comparison excitation voltage values; and
determining in which of the one or more windings the fault is located based on the comparison of the one or more winding-comparison excitation voltage values.

18. The method of claim 12, wherein the transformer is a multi-phase transformer, further comprising:
determining the location of the fault based on an equivalent circuit of the multi-phase transformer which represents voltage and current conditions in the one or more windings, impedances of the one or more windings, a transformer magnetizing impedance, and at least one of a phase to ground fault on the one or more windings or a phase to phase fault on the one or more windings; and determining the voltage and current conditions from the determined electrical flow parameters of the one or more windings.

19. The method of claim 18, wherein the equivalent circuit of the multi-phase transformer further represents at least one of a transformer leakage resistance or a transformer leakage reactance.

20. The method of claim 12, wherein the transformer is a single-phase transformer, further comprising:
- determining the location of the fault based on an equivalent circuit of the single-phase transformer which represents voltage and current conditions in the one or more windings, impedances of the one or more windings, a transformer magnetizing impedance, and at least one of an inter-turn fault, a winding to winding fault, or a winding to ground fault on the one or more windings; and
- determining the voltage and current conditions from the determined electrical flow parameters of the windings.

\* \* \* \* \*